(12) United States Patent
Bito

(10) Patent No.: US 7,071,499 B2
(45) Date of Patent: Jul. 4, 2006

(54) HETEROJUNCTION FIELD EFFECT TYPE SEMICONDUCTOR DEVICE HAVING HIGH GATE TURN-ON VOLTAGE AND LOW ON-RESISTANCE AND ITS MANUFACTURING METHOD

(75) Inventor: Yasunori Bito, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/720,094

(22) Filed: Nov. 25, 2003

(65) Prior Publication Data

US 2004/0104404 A1 Jun. 3, 2004

(30) Foreign Application Priority Data

Nov. 26, 2002 (JP) ............... 2002-342691

(51) Int. Cl.
*H01L 21/338* (2006.01)
(52) U.S. Cl. .............. 257/194; 257/195; 257/192; 257/280
(58) Field of Classification Search ............. 257/192, 257/194, 195, 280, 284
See application file for complete search history.

(56) References Cited

U.S. PATENT DOCUMENTS

2001/0005016 A1* 6/2001 Bito et al. ............. 257/24
2001/0019131 A1* 9/2001 Kato et al. ............. 257/76

FOREIGN PATENT DOCUMENTS

| EP | 0940855 A2 | 9/1999 |
|---|---|---|
| JP | 54-21283 | 2/1979 |
| JP | 2001-250939 A | 9/2001 |

OTHER PUBLICATIONS

Y. Bito et al., "64% Efficiency Enhancement-Mode Power Heterojunction Fet for 3.5 V Li-ION Battery Operated Personal Digital Cellular Phones", 1998 IEEE MTT-S Int. Microwave Symp-Dig., Jun. 1998, pp. 439-442 with Abstract.
S. Wada et al., "0.1-µm $p^+$-GaAs Gate HJFET's Fabricated Using Two-Step Dry-Etching and Selective MOMBE Growth Techniques", IEEE Transactions on Electron Devices, vol. 45, No. 6, Jun. 1998, pp. 1383-1389 with Abstract.

(Continued)

*Primary Examiner*—Thomas L. Dickey
(74) *Attorney, Agent, or Firm*—Sughrue Mion, PLLC

(57) ABSTRACT

In a heterojunction field effect type semiconductor device, a channel layer is formed over a GaAs substrate, and a first semiconductor layer including no aluminum is formed over the channel layer. First and second cap layers of a first conductivity type are formed on the first semiconductor layer, to create a recess on the first semiconductor layer. First and second ohmic electrodes are formed on the first and second cap layers, respectively. A second semiconductor layer of a second conductivity type is formed on the first semiconductor layer within the recess, and the semiconductor layer is isolated from the first and second cap layers. A gate electrode is formed on the second semiconductor layer.

16 Claims, 26 Drawing Sheets

OTHER PUBLICATIONS

K. Nishii et al., "High Current/gm Self-Aligned PJ-HFET of Completely Enhancement-Mode Operation", Extended Abstracts of the 1998 International Conference on Solid-State Devices and Materials, 1998, pp. 396-397.

K. Nishii et al.; "High Current/gm Self-Aligned PJ-HFET of Completely Enhancement-Mode Operation"; Extended Abstracts of the International Conference on Solid State Devices and Materials; Japan Society of Applied Physics, Tokyo, Japan; Sep. 1998; pp. 396-397.

Y. Bito et al.; "64% Efficiency Enhancement-Mode Power Heterojunction FET for 3.5 V Li-ION Battery Operated Personal Digital Cellular Phones"; 1998 IEEE MTT-S International Microwave Symposium Digest; IMS '98; Progress Through Microwaves; Baltimore, MD, Jun. 7-12, 1998; IEEE MTT-S International Microwave Symposium Digest, New York, NY: IEEE, US, vol. 2, Jun. 7, 1998; pp. 439-442.

Y. Bito et al., Institute of Electrical and Electronics Engineers; "Enhancement-Mode Power Heterojunction FET utilizing Re-grown P+-GaAs Gate with Negligible Off-state Leakage Current"; 2003 IEEE MTT-S International Microwave Symposium Digest; (IMS 2003); Philadelphia, PA, Jun. 8-13, 2003; IEEE MTT-S International Microwave Symposium, New York, NY: IEEE, US, vol. 3 of 3, Jun. 8, 2003; pp. 703-706.

* cited by examiner

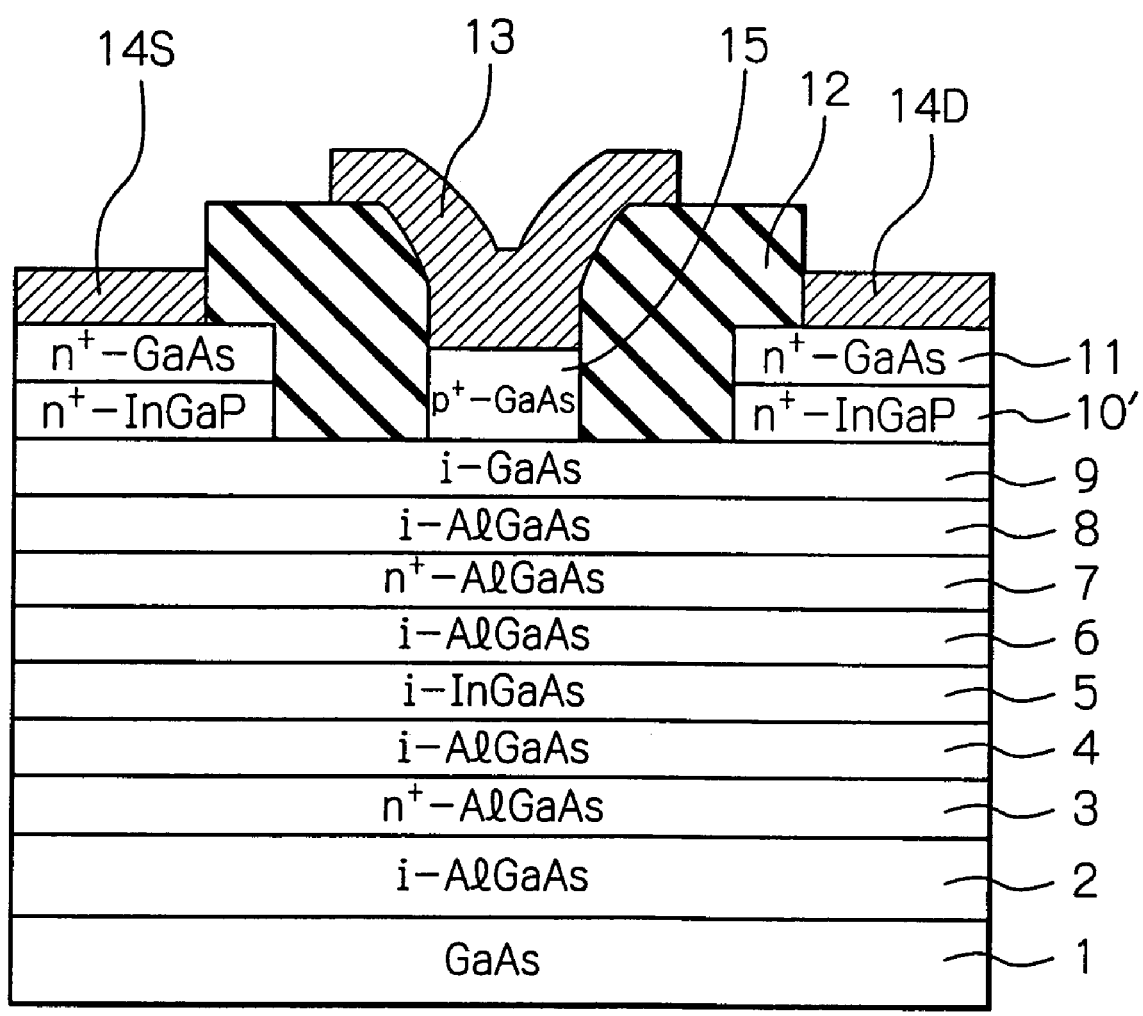

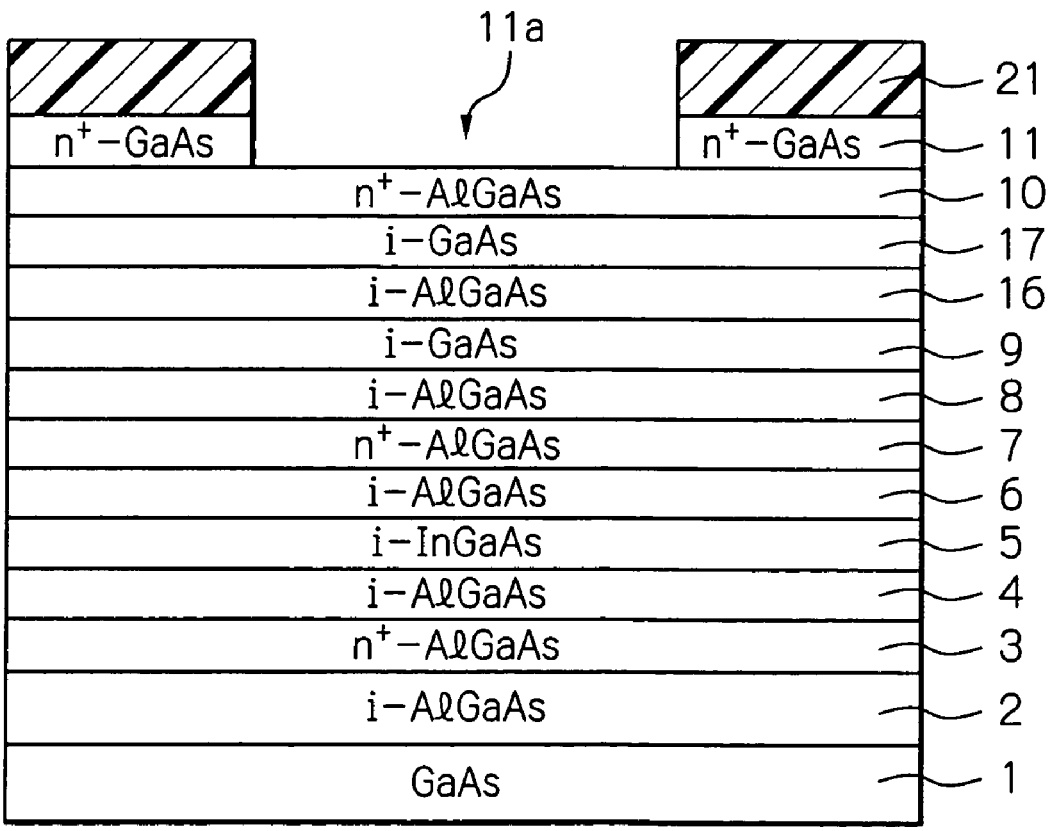

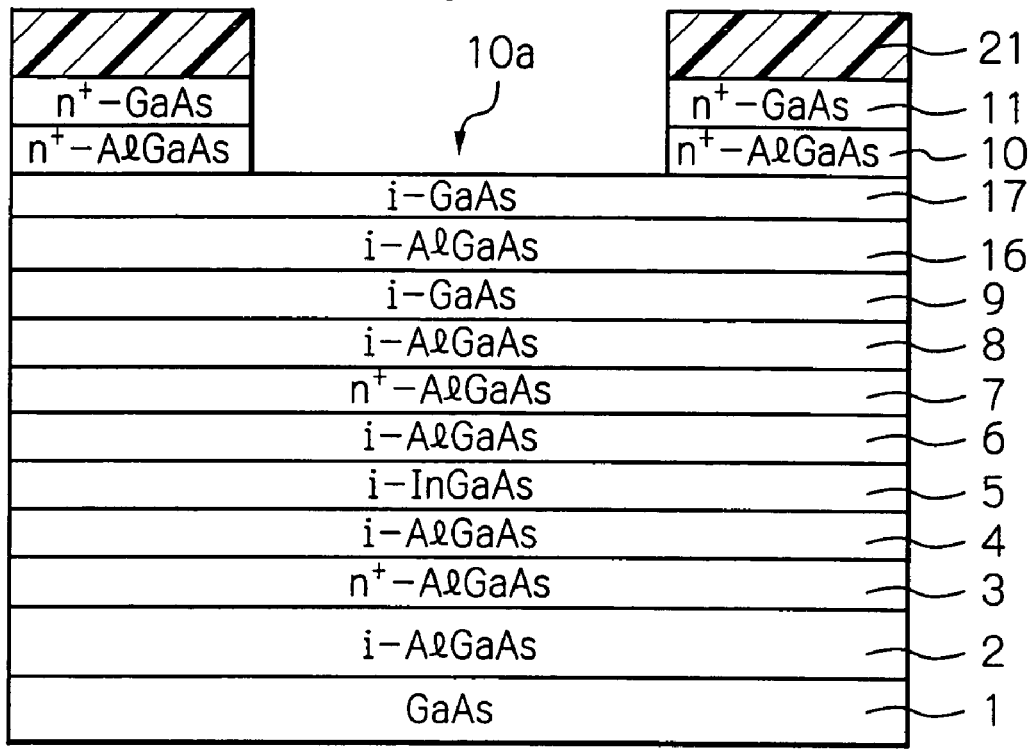
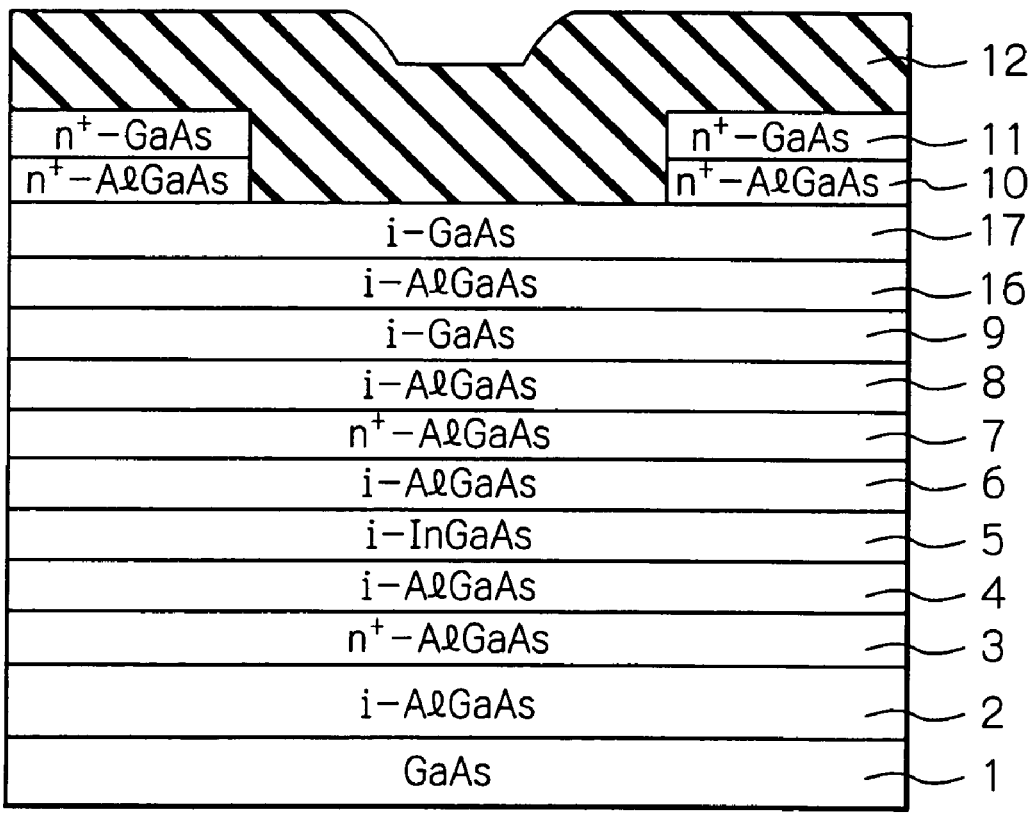

HETEROJUNCTION FIELD EFFECT TYPE SEMICONDUCTOR DEVICE HAVING HIGH GATE TURN-ON VOLTAGE AND LOW ON-RESISTANCE AND ITS MANUFACTURING METHOD

BACKGROUND OF THE INVENTION

1. Field of the Invention

The present invention relates to a heterojunction field effect type semiconductor device and its manufacturing method.

2. Description of the Related Art

Generally, in a transmitter of a mobile handset, a power amplifier has been required to operate at a lower voltage and have a lower ON-resistance. A GaAs heterojunction field effect type semiconductor device is used as such a power amplifier.

In a first prior art GaAs heterojunction field effect type semiconductor device (see: Yasunori BITO et al., FIG. 2 of "64% Efficiency Enhancement-Mode Power Heterojunction FET for 3.5V Li-Ion Battery Operated Personal Digital Cellular Phones", 1998 IEEE MTT-S Int. Microwave Symp-Dig., pp. 439–442, June 1998), a channel layer, an undoped AlGaAs Schottky layer, an undoped GaAs layer and a Si-doped $n^+$-type cap layer are sequentially grown by an epitaxial growth process, and a double-recess structure is provided in the Si-doped $n^+$-type cap layer and the undoped GaAs Schottky layer. Then, a gate electrode is formed on the undoped AlGaAs Schottky layer via the double-recess structure, and an ohmic source electrode and an ohmic drain electrode are formed on the Si-doped $n^+$-type cap layer. This will be explained later in detail.

In the above-described first prior art GaAs field effect type semiconductor device, since the double-recess structure is adopted, the ON-resistance can be decreased.

In the above-described first prior art GaAs field effect type semiconductor device, however, since the gate electrode is in direct contact with the undoped AlGaAs Schottky layer, the effective Schottky barrier therebetween is so small, i.e., about 1.0 eV that the gate turn-on voltage $V_f$ is small, i.e., about 0.7V. Therefore, in a normal operation, the gate electrode is forwardly turned ON to create a gate current leakage.

In a second prior art GaAs heterojunction field effect type semiconductor device (see: Shigeki WADA et al., "0.1-μm p+-GaAs Gate HJFET's Fabricated Using Two-Step Dry-Etching and Selective MOMBE Growth Techniques", IEEE Transactions on Electron Devices, Vol. 45, No. 6, pp. 1183–1189, June 1998), a channel layer, an undoped AlGaAs Schottky layer and a Si-doped $n^+$-type cap layer are sequentially grown by a first epitaxial growth process, and a recess structure is provided in the Si-doped $n^+$-type cap layer. Then, a carbon-doped $p^+$-type GaAs layer is grown on the undoped AlGaAs Schottky layer by a second epitaxial growth process. Then, a gate electrode is formed on the carbon-doped $p^+$-type AlGaAs Schottky layer, and an ohmic source electrode and an ohmic drain electrode are formed on the Si-doped $n^+$-type cap layer. This also will be explained later in detail.

In the above-described second prior art GaAs heterojunction field effect type semiconductor device, since the carbon-doped $p^+$-type GaAs layer forms a $p^+$-n junction with its underlying layers, an effective Schottky barrier against electrons within a channel formed in the undoped InGaAs channel layer is substantially increased. That is, this effective Schottky barrier is increased to a degree of the bandgap of the carbon-doped $p^+$-type GaAs layer such as 1.4 eV.

In the above-described second prior art GaAs field effect type semiconductor device, however, although the effective Schottky barrier is increased from about 1.0 eV to about 1.4 eV by about 0.4 eV as compared with the above-described first prior art GaAs field effect type semiconductor device, the gate turn-on voltage $V_f$ is increased from about 0.7V to about 0.9V by only about 0.2V as compared with the above-described first prior art GaAs field effect type semiconductor device due to the direct contact of the carbon-doped $p^+$-type GaAs layer with the undoped AlGaAs Schottky layer. Therefore, in a normal operation, the gate electrode is still forwardly turned ON to create a gate leakage current.

In a third prior art GaAs heterojunction field effect type semiconductor device (see: K. NISHI et al., "High Current/gm self-Alignment PJ-HFET of Completely Enhancement-Mode Operation", Extended Abstracts of the 1998 International Conference on Solid-State Devices and Materials, pp. 396–397, 1998), a channel layer, an undoped AlGaAs Schottky layer, an undoped GaAs Schottky layer and a carbon-doped $p^+$-type GaAs layer are sequentially grown at an epitaxial growth process. Also, a gate electrode is formed on the carbon-doped $p^+$-type GaAs layer. Further, an ohmic source electrode and an ohmic drain electrode are formed on the $n^+$-type contact regions. This also will be explained later in detail.

In the above-described third prior art GaAs heterojunction field effect type semiconductor device, no defects are induced in the epitaxially grown carbon-doped $p^+$-type GaAs layer, so that the gate turn-on voltage $V_f$ can be increased to about 1.12V by about 0.22V as compared with the above-described second prior art GaAs heterojunction field effect type semiconductor device.

In the above-described third prior art GaAs field effect type semiconductor device, however, the ON-resistance is large, which will be explained in detail.

SUMMARY OF THE INVENTION

It is an object of the present invention to provide a heterojunction field effect type semiconductor device having a high gate turn-on voltage and a low ON-resistance.

According to the present invention, in a heterojunction field effect type semiconductor device, a channel layer is formed over a GaAs substrate, and a first semiconductor layer including no aluminum is formed over the channel layer. First and second cap layers of a first conductivity type are formed on the first semiconductor layer, to create a recess on the first semiconductor layer. First and second ohmic electrodes are formed on the first and second cap layers, respectively. A second semiconductor layer of a second conductivity type is formed on the first semiconductor layer within the recess, and the second semiconductor layer is isolated from the first and second cap layers. A gate electrode is formed on the second semiconductor layer.

Also, in a method for manufacturing a heterojunction field effect type semiconductor device, at least a channel layer, a first semiconductor layer having no aluminum, a wide recess etching stopper layer of a first conductivity type, and a cap layer of the first conductivity type are grown over a GaAs substrate by a first epitaxial growth process. Then, the cap layer is selectively removed by using the wide recess etching stopper layer as a stopper to create a recess within the cap layer. Then, an insulating layer made of $SiO_2$ or the like is deposited on the entire surface. Then, the insulating layer is perforated to expose the first semiconductor layer. Then, a second semiconductor layer of a second conductivity type is grown by a second epitaxial growth process, so that the second semiconductor layer is buried in the recess and contacts the first semiconductor layer. Then, a gate electrode is formed on the second semiconductor layer. Finally, ohmic electrodes are formed on the cap layer.

BRIEF DESCRIPTION OF THE DRAWINGS

The present invention will be more clearly understood from the description set forth below, as compared with the prior art, with reference to the accompanying drawings, wherein:

FIGS. 6 and 7 are cross-sectional views illustrating first and second modifications of the GaAs heterojunction field effect type semiconductor device of FIG. 4;

FIGS. 10A through 10J are cross-sectional views for explaining a method for manufacturing the GaAs heterojunction field effect type semiconductor device of FIG. 8.

DESCRIPTION OF THE PREFERRED EMBODIMENTS

Before the description of the preferred embodiments, prior art GaAs heterojunction field effect type semiconductor devices (transistors) will be explained with reference to FIGS. 1, 2 and 3.

Figure 1:
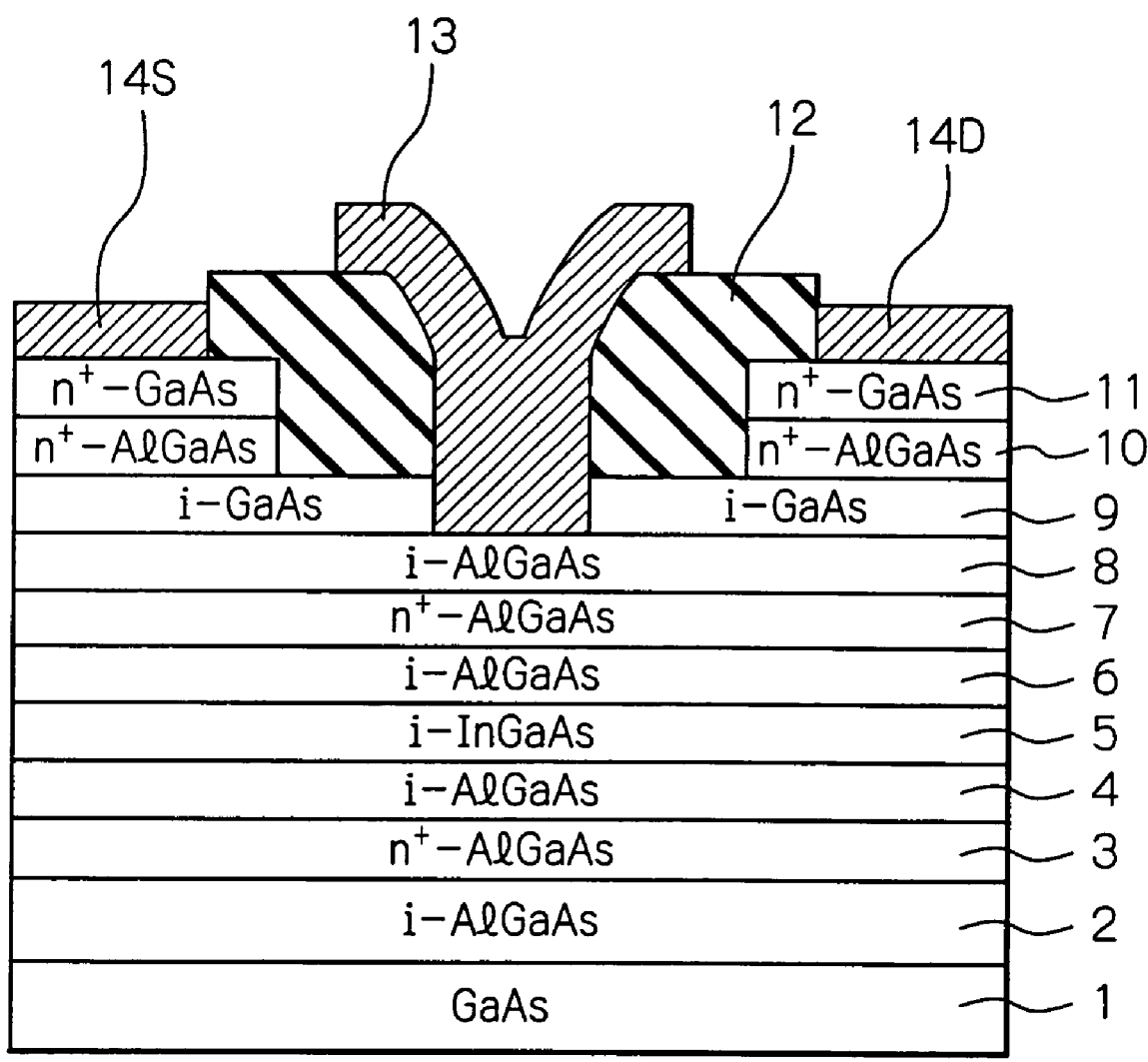
FIG. 1 is a cross-sectional view illustrating a first prior art GaAs heterojunction field effect type semiconductor device.

In FIG. 1, which illustrates a first prior art GaAs heterojunction field effect type semiconductor device (see: Yasunori BITO et al., FIG. 2 of "64% Efficiency Enhancement-Mode power Heterojunction FET for 3.5V Li-Ion Battery Operated Personal Digital Cellular Phones", 1998 IEEE MTT-S Int. Microwave Symp-Dig., pp. 439–442, June 1998), reference numeral 1 designates a semi-insulating GaAs substrate. Also, an undoped AlGaAs buffer layer 2, an Si-doped $n^+$-type AlGaAs electron supply layer 3, an undoped AlGaAs spacer layer 4, an undoped InGaAs channel layer 5, an undoped AlGaAs spacer layer 6, a Si-doped $n^+$-type AlGaAs electron supply layer 7, an undoped AlGaAs Schottky layer 8, an undoped GaAs Schottky layer 9, a Si-doped $n^+$-type AlGaAs wide recess etching stopper layer 10 and a Si-doped $n^+$-type GaAs cap layer 11 are sequentially grown on the GaAs substrate 1 by an epitaxial growth process. Also, an insulating layer 12 made of silicon dioxide is formed on the undoped GaAs Schottky layer 9. Further, a gate electrode 13 made of aluminum or the like is formed on the undoped AlGaAs Schottky layer 8 via a recess within the undoped GaAs layer 9. Additionally, an ohmic source electrode 14S and an ohmic drain electrode 14D made of AuGe/Au or the like are formed on the Si-doped $n^+$-type GaAs cap layer 11.

In the GaAs heterojunction field effect type semiconductor device of FIG. 1, since a double recess structure is adopted, the ON-resistance between the ohmic source electrode 14S and the ohmic drain electrode 14D can be decreased.

In the GaAs field effect type semiconductor device of FIG. 1, however, since the gate electrode 13 is in direct contact with the undoped AlGaAs Schottky layer 8, the effective Schottky barrier therebetween is so small, i.e., about 1.0 eV that the gate turn-on voltage $V_f$ is small, i.e., about 0.7V. Therefore, in a normal operation, the gate electrode 13 is forwardly turned ON to create a gate leakage current.

Note that a gate turn-on voltage is defined when a gate current leakage is 1 mA/mm.

Figure 2:
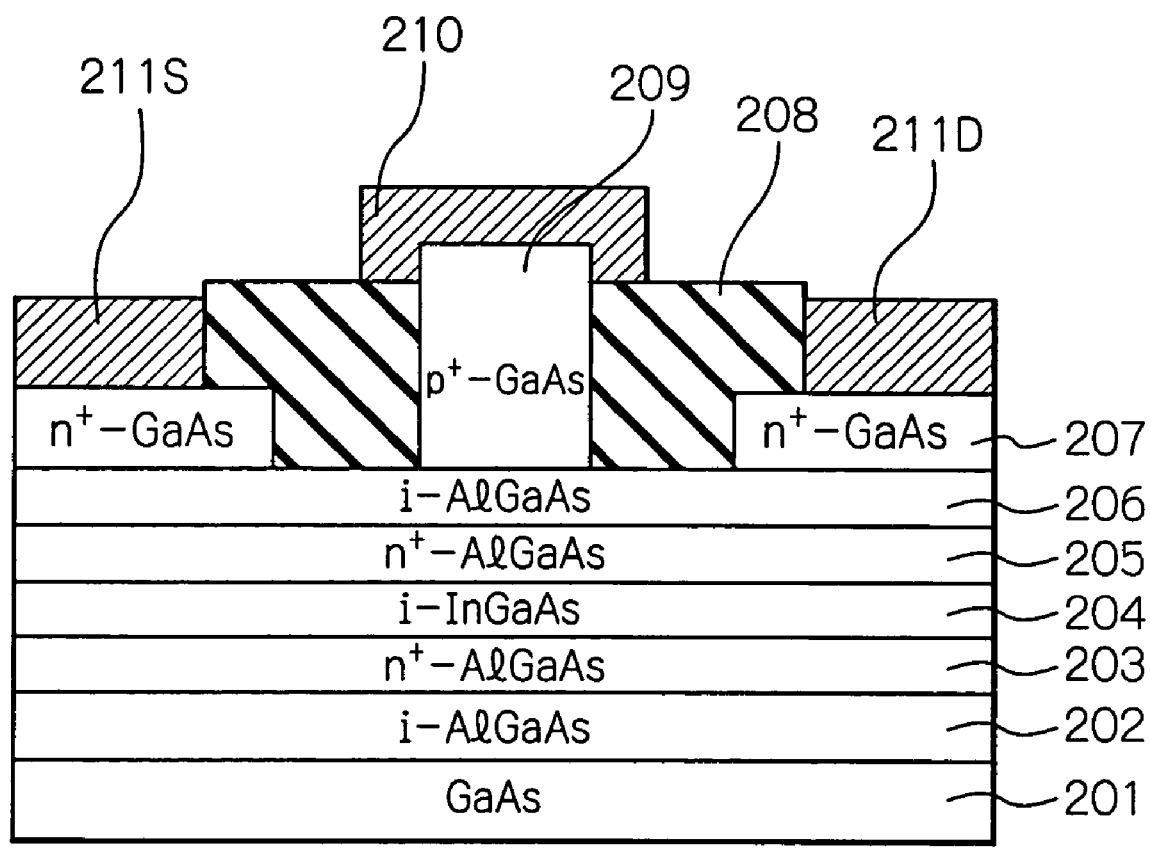
FIG. 2 is a cross-sectional view illustrating a second prior art GaAs heterojunction field effect type semiconductor device.

In FIG. 2, which illustrates a second prior art GaAs heterojunction field effect type semiconductor device (see: Shigeki WADA et al., "0.1-μm $p^+$-GaAs Gate HJFET's Fabricated Using Two-Step Dry-Etching and Selective MOMBE Growth Techniques", IEEE Transactions on Electron Devices, Vol. 45, No. 6, pp. 1383–1389, June 1998), reference numeral 201 designates a semi-insulating GaAs substrate. Also, an undoped AlGaAs buffer layer 202, an Si-doped $n^+$-type AlGaAs electron supply layer 203, an undoped InGaAs channel layer 204, a Si-doped $n^+$-type AlGaAs electron supply layer 205, an undoped AlGaAs Schottky layer 206, and a Si-doped $n^+$-type GaAs cap layer 207 are sequentially grown on the GaAs substrate 201 by a first epitaxial growth process. Also, an insulating layer 208 made of silicon dioxide is formed on the undoped AlGaAs Schottky layer 206. Further, a carbon-doped $p^+$-type GaAs layer 209 is grown on the undoped AlGaAs Schottky layer 206 via a recess within the insulating layer 208 by a second epitaxial growth process. Additionally, a gate electrode 210 made of aluminum or the like is formed on the carbon-doped $p^+$-type GaAs layer 209. Further, an ohmic source electrode 211S and an ohmic drain electrode 211D made of AuGe/Au or the like are formed on the Si-doped $n^+$-type GaAs cap layer 207.

In the GaAs heterojunction field effect type semiconductor device of FIG. 2, since the carbon-doped $p^+$-type GaAs layer 209 forms a $p^+$-n junction with its underlying layers, an effective Schottky barrier against electrons within a channel formed in the undoped InGaAs channel layer 204 is substantially increased. That is, this effective Schottky barrier is increased to a degree of the bandgap of the carbon-doped $p^+$-type GaAs layer 209 such as 1.4 eV.

In the GaAs field effect type semiconductor device of FIG. 2, however, although the effective Schottky barrier is increased from about 1.0 eV to about 1.4 eV by about 0.4 eV as compared with the GaAs field effect type semiconductor device of FIG. 1, the gate turn-on voltage $V_f$ is increased from about 0.7V to about 0.9V by only about 0.2V as compared with the GaAs field effect type semiconductor device of FIG. 1. Therefore, in a normal operation, the gate electrode 210 is still forwardly turned ON to create a gate leakage current.

The reason why the gate turn-on voltage $V_f$ is not so increased is that the carbon-doped p$^+$-type GaAs layer 209 is epitaxially grown directly on the undoped AlGaAs Schottky layer 206. That is, since the undoped AlGaAs Schottky layer 206 is exposed to the air, the aluminum component of the undoped AlGaAs Schottky layer 206 actively reacts with oxygen so that aluminum oxide is created thereon. Since the aluminum oxide is difficult to be removed, the aluminum oxide induces defects in the epitaxially-grown carbon-doped p$^+$-type GaAs layer 209, so that the gate turn-on voltage $V_f$ is decreased to create a gate leakage current.

Figure 3:
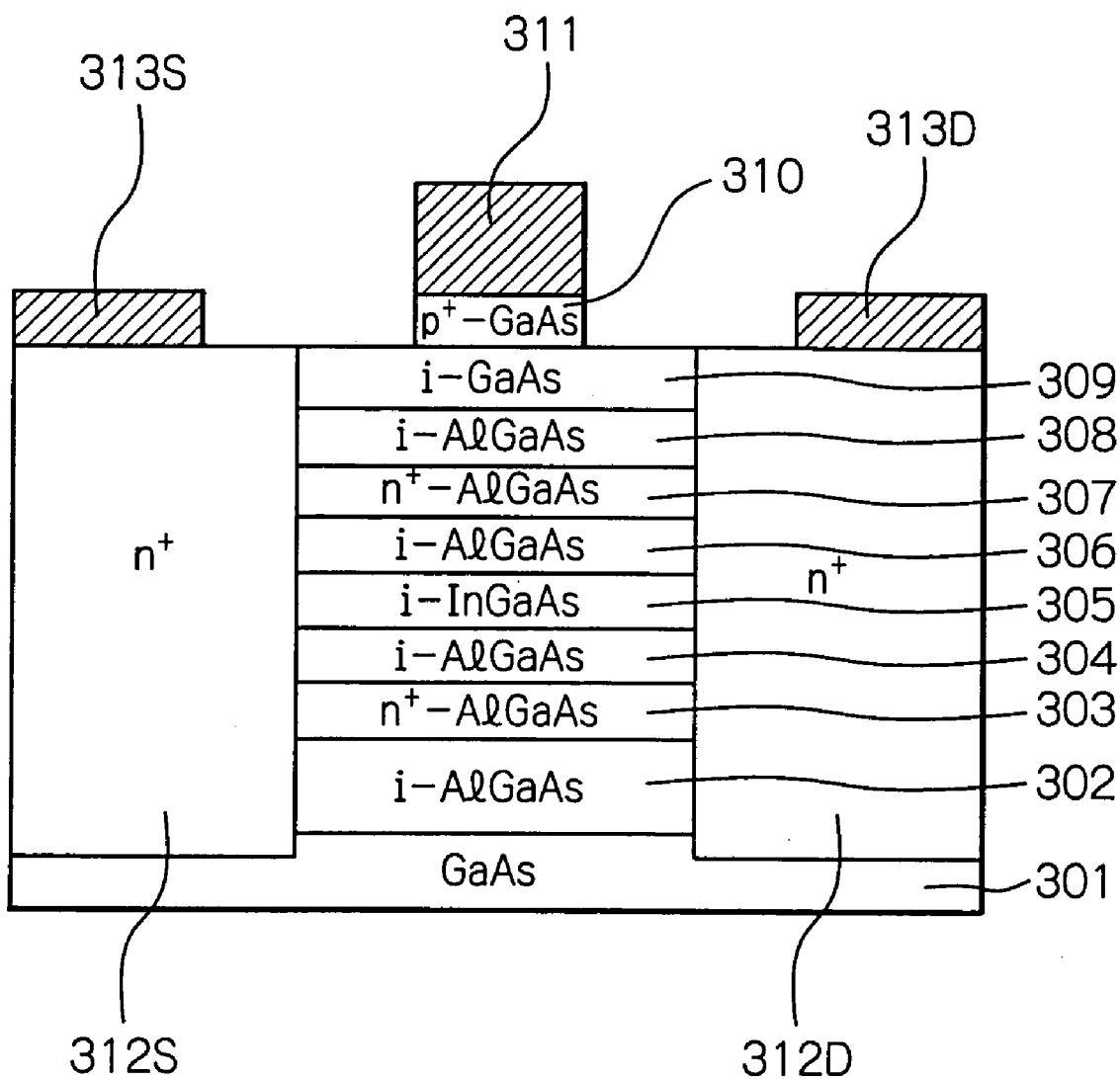
FIG. 3 is a cross-sectional view illustrating a third prior art GaAs heterojunction field effect type semiconductor device.

In FIG. 3, which illustrates a third prior art GaAs heterojunction field effect type semiconductor device (see: K. NISHI et al., "High Current/gm self-Alignment PJ-HFET of Completely Enhancement-Mode Operation", Extended Abstracts of the 1998 International Conference on Solid-State Devices and Materials, pp. 396–397, 1998), reference numeral 301 designates a semi-insulating GaAs substrate. Also, an undoped AlGaAs buffer layer 302, an Si-doped n$^+$-type AlGaAs electron supply layer 303, an undoped AlGaAs spacer layer 304, an undoped InGaAs channel layer 305, an undoped AlGaAs spacer layer 306, a Si-doped n$^+$-type AlGaAs electron supply layer 307, an undoped AlGaAs Schottky layer 308, an undoped GaAs Schottky layer 309 and a carbon-doped p$^+$-type GaAs layer 310 are sequentially grown on the GaAs substrate 301 by an epitaxial growth process. Also, a gate electrode 311 made of WSi or the like is formed on the carbon-doped p$^+$-type GaAs layer 310. Further, n$^+$-type contact regions 312S and 312D are formed in the substrate 301 and the layers 302 through 309 by an implantation of Si in self-alignment with the gate electrode 311 and the carbon-doped p$^+$-type GaAs layer 310. In this case, the gate electrode 311 and the carbon-doped p$^+$-type GaAs layer 310 are larger than those as illustrated in FIG. 3. After the gate electrode 311 and the carbon-doped p$^+$-type GaAs layer 310 are further reduced by an etching process as illustrated in FIG. 3, an ohmic source electrode 313S and an ohmic drain electrode 313D made of AuGe/Au or the like are formed on the n$^+$-type contact regions 312S and 312D, respectively.

In the GaAs heterojunction field effect type semiconductor device of FIG. 3, the carbon-doped p$^+$-type GaAs layer 310 as well as the other layers 302 through 309 is grown in the same epitaxial growth process, and the carbon-doped p$^+$-type GaAs layer 310 is not in contact with the undoped AlGaAs Schottky layer 308, there is no oxide at the bottom of the carbon-doped p$^+$-type GaAs layer 310, so that no defects are induced in the epitaxially grown carbon-doped p$^+$-type GaAs layer 310, thus increasing the gate turn-on voltage $V_f$ to about 1.12V by about 0.22V as compared with the GaAs heterojunction field effect type semiconductor device of FIG. 2.

In the GaAs field effect type semiconductor device of FIG. 3, however, the ON-resistance between the ohmic source electrode 313S and the ohmic drain electrode 313D is large. That is, since the ohmic source electrode 313S and the ohmic drain electrode 313D are connected to the n$^+$-type contact regions 312S and 312D, respectively, the contact resistances therebetween are large which would increase the ON-resistance. Also, since the distance between a channel created in the undoped InGaAs channel layer 305 and the surface of the undoped GaAs Schottky layer 309 is small, the concentration of sheet carriers in the channel is decreased by the surface depletion region of the undoped InGaAs GaAs Schottky layer 309, so that the sheet resistance of a region between the gate electrode 311 and the n$^+$-type contact regions 312S and 312D is large, which also would increase the ON-resistance. Particularly when the GaAs field effect type semiconductor device of FIG. 3 is applied to an enhancement type field effect transistor having a positive threshold voltage, since the distance between the carbon-doped p$^+$-type GaAs layer 310 and the above-mentioned channel is further decreased, the concentration of sheet carriers in the channel is further decreased, so that the above-mentioned sheet resistance per unit area is several thousands of Ω. Thus, the GaAs field effect type semiconductor device of FIG. 3 cannot be applied to mobile handsets operating at a low voltage such as 3V.

Figure 4:
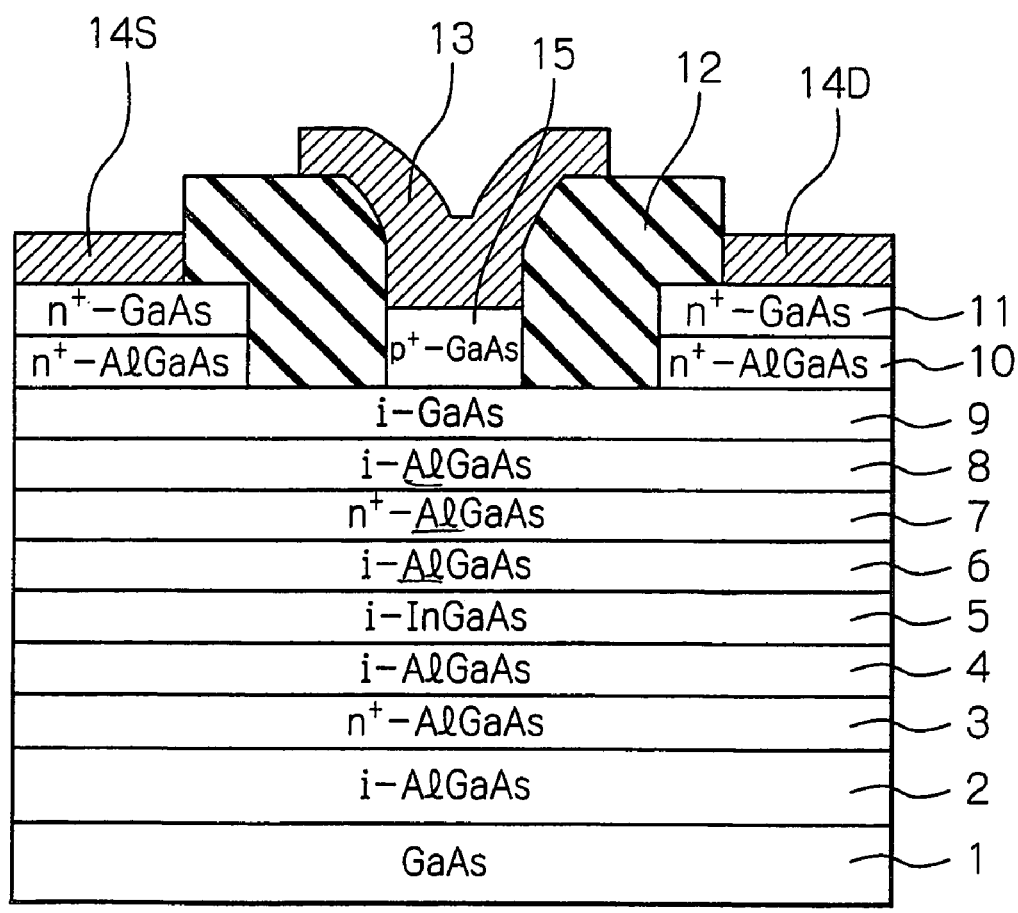
FIG. 4 is a cross-sectional view illustrating a first embodiment of the GaAs heterojunction field effect type semiconductor device according to the present invention.

In FIG. 4, which illustrates a first embodiment of the GaAs heterojunction field effect type semiconductor device according to the present invention, a carbon-doped p$^+$-type GaAs layer 15 corresponding to the carbon-doped p$^+$-type GaAs layer 209 of FIG. 2 is added to the elements of FIG. 1. Also, the carbon-doped p$^+$-type GaAs layer 15 is in contact with the undoped GaAs Schottky layer 9, not the undoped AlGaAs Schottky layer 8.

Since the carbon-doped p$^+$-type GaAs layer 15 is not in contact with the undoped AlGaAs Schottky layer 8 whose aluminum component is easily oxidized, the gate turn-on voltage $V_f$ can be increased to about 1.2V.

Also, in a similar way to in the GaAs heterojunction field effect type semiconductor device of FIG. 1, the ON-resistance between the ohmic source electrode 14S and the ohmic drain electrode 14D can be small, i.e., about 2Ω·mm.

A method for manufacturing the GaAs heterojunction field effect type semiconductor device of FIG. 4 will be explained next with reference to FIGS. 5A through 5H.

Figures 5A, 5B:
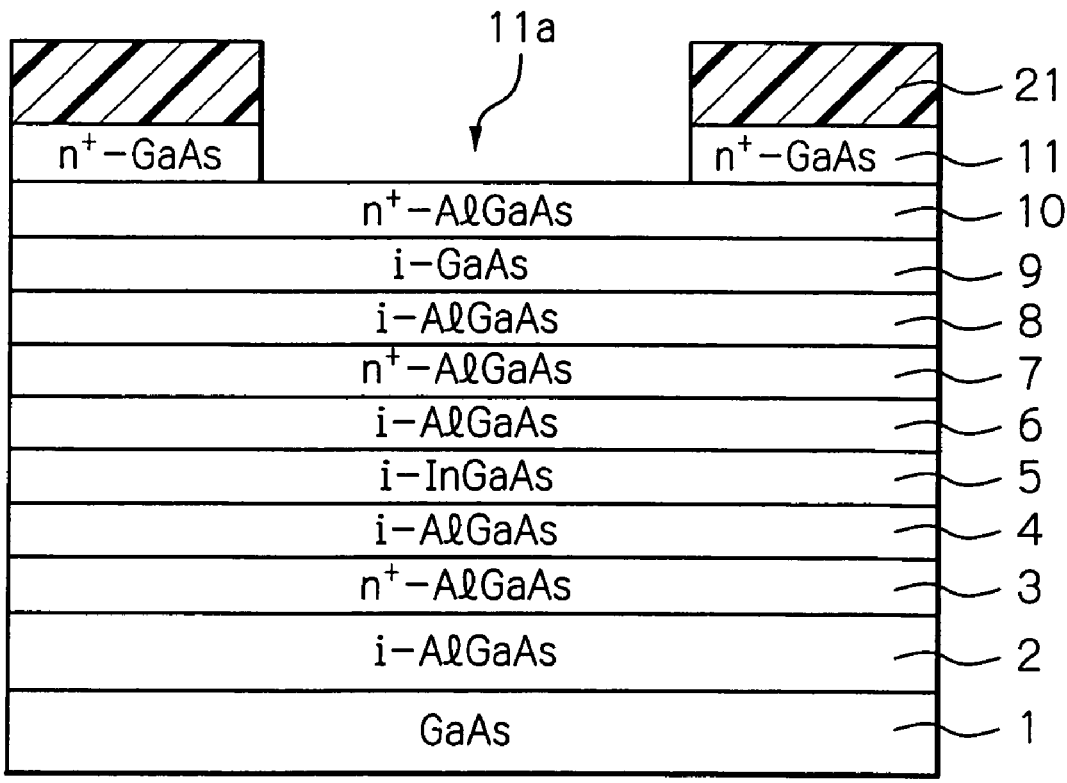
FIGS. 5A through 5H are cross-sectional views for explaining a method for manufacturing the GaAs heterojunction field effect type semiconductor device of FIG. 4.

First, referring to FIG. 5A, an about 50 nm thick undoped AlGaAs buffer layer 2, an about 4 nm thick n$^+$-type AlGaAs electron supply layer 3 having about 3×10$^{18}$ Si atoms cm$^{-3}$ doped therein, an about 2 nm thick undoped AlGaAs spacer layer 4, an about 15 nm thick undoped InGaAs channel layer 5, an about 2 nm thick undoped AlGaAs spacer layer 6, an about 9 nm thick n$^+$-type AlGaAs electron supply layer 7 having about 3×10$^{18}$ Si atoms cm$^{-3}$ doped therein, an about 7 nm thick AlGaAs Schottky layer 8, an about 5 nm thick undoped GaAs Schottky layer 9, an about 5 nm thick n$^+$-type AlGaAs wide recess etching stopper layer 10 having about 4×10$^{18}$ Si atoms cm$^{-3}$ doped therein and an about 100 nm thick n$^+$-type GaAs cap layer 11 having 4×10$^{18}$ Si atoms cm$^{-3}$ doped therein are sequentially grown on a semi-insulating GaAs substrate 1 by a first epitaxial growth process using a molecular beam epitaxy (MBE) method or a metalorganic vapor phase epitaxy (MOVPE) method.

Next, referring to FIG. 5B, a photoresist pattern 21 is formed by a photolithography process. Then, the n$^+$-type GaAs cap layer 11 is etched by a dry etching process using the photoresist pattern 21 as a mask and the n$^+$-type AlGaAs wide recess etching stopper layer 10 as a stopper. In this case, a part of the n$^+$-type AlGaAs wide recess etching stopper layer 10 is also etched. Thus, a wide recess 11a is created in the n$^+$-type GaAs cap layer 11.

Figure 5C:
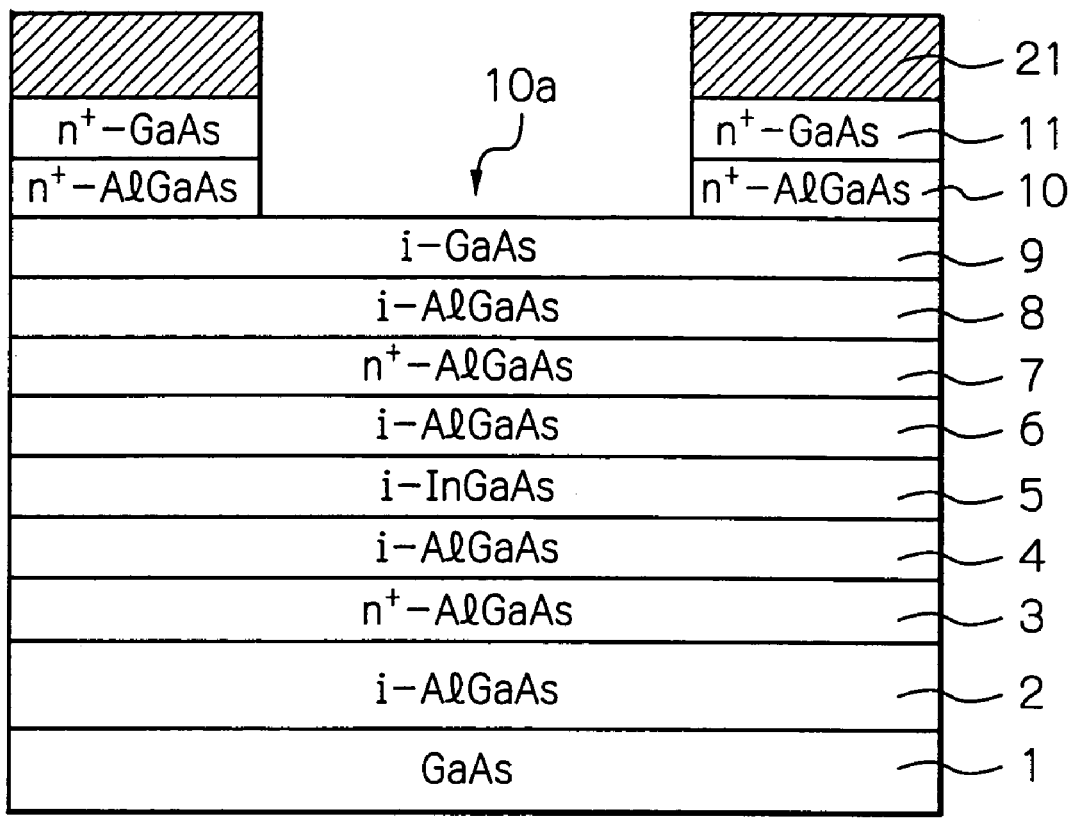

Next, referring to FIG. 5C, the remainder of the n$^+$-type AlGaAs wide recess etching stopper layer 10 is completely removed by a rinsing process. Then, the photoresist pattern 21 is removed. Thus, the wide recess 11a is further increased to create a wide recess 10a.

Figure 5D:
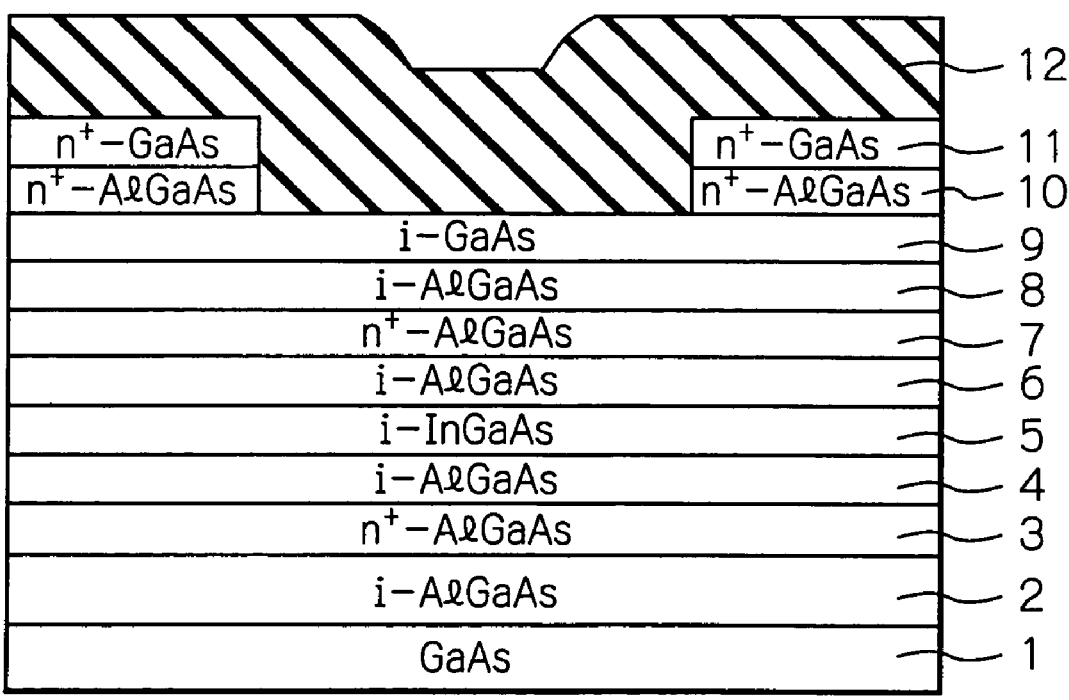

Next, referring to FIG. 5D, an insulating layer 12 made of silicon dioxide is deposited on the entire surface by a chemical vapor deposition (CVD) process.

Figure 5E:
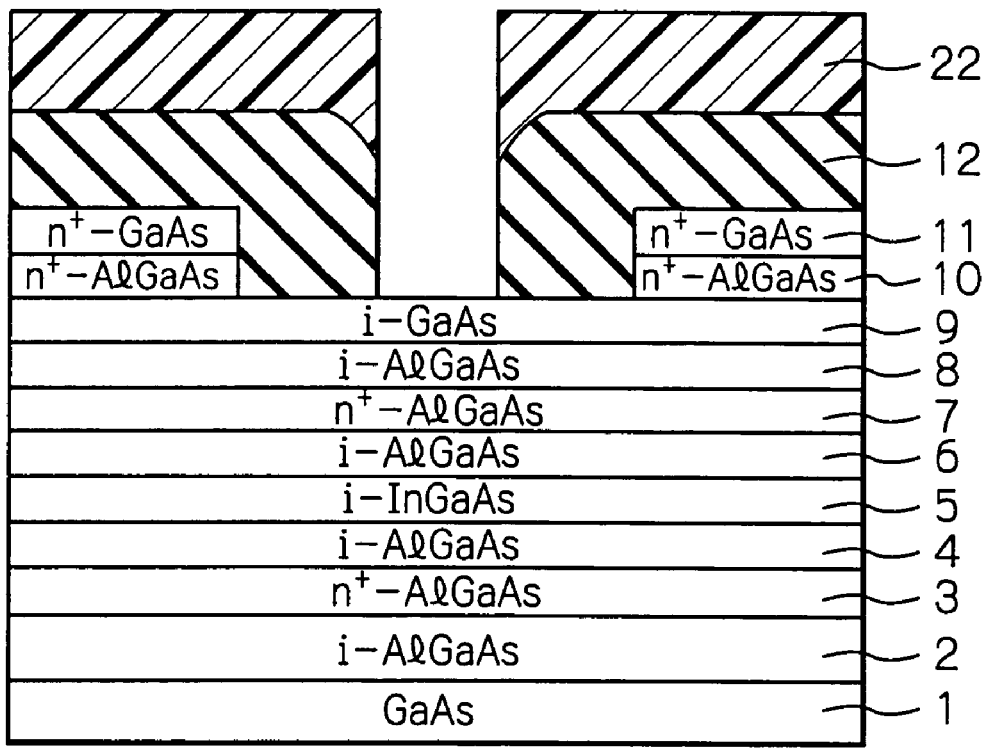

Next, referring to FIG. 5E, a photoresist pattern 22 is formed by a photolithography process. Then, the insulating layer 12 is etched by an etching process using the photoresist pattern 22 as a mask. As a result, the undoped GaAs Schottky layer 9 is exposed. Then, the photoresist pattern 22 is removed.

Figure 5F:
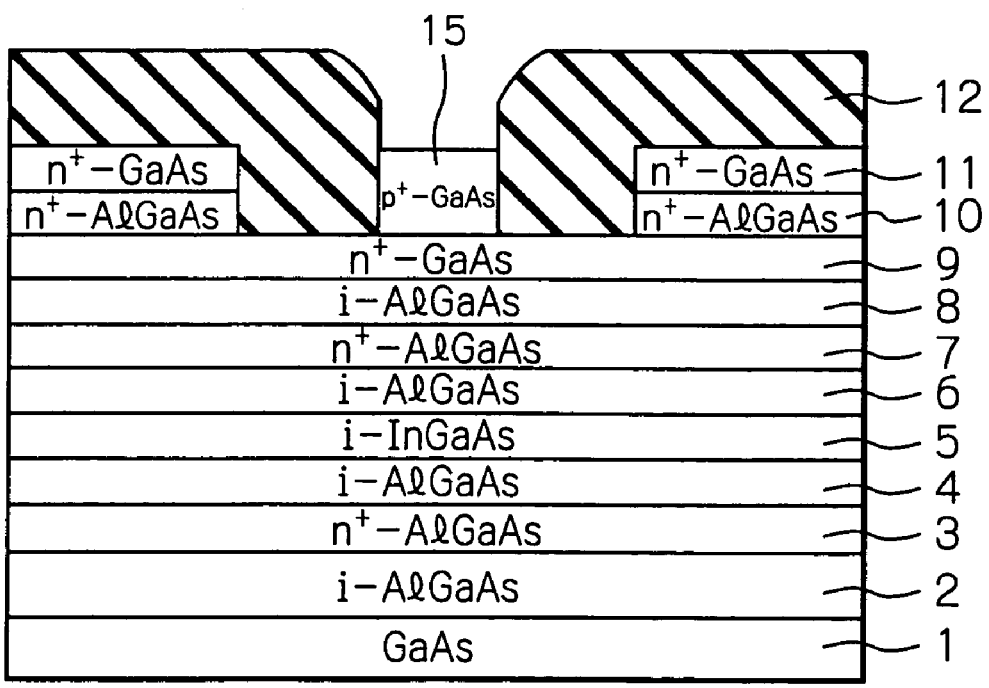

Next, referring to FIG. 5F, an about 80 nm thick carbon-doped p$^+$-type GaAs layer 15 having about $1\times10^{20}$ carbon atoms cm$^{-3}$ doped therein is selectively grown on the exposed undoped GaAs Schottky layer 9 by a second epitaxial growth process using an MOVPE method.

Figure 5G:
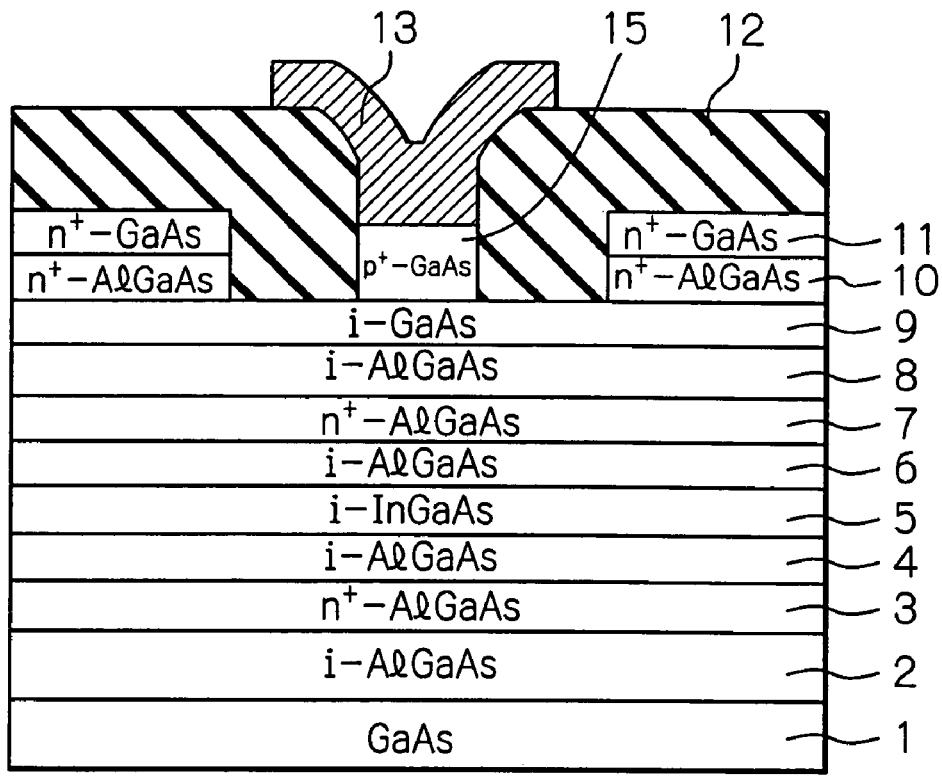

Next, referring to FIG. 5G, a gate electrode 13 made of WSi is formed by a sputtering process. Then, the gate electrode 13 is patterned by a photolithography and etching process.

Figure 5H:
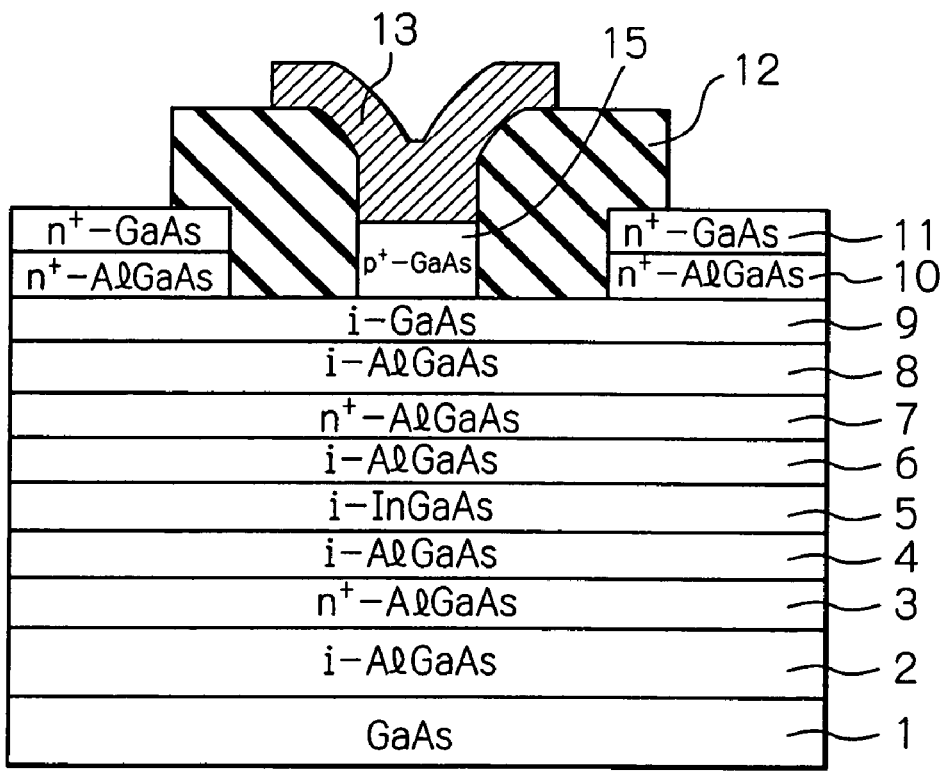

Next, referring to FIG. 5H, the insulating layer 12 is further patterned by a photolithography and etching process. Thus, the n$^+$-type GaAs layer 11 is exposed.

Finally, returning to FIG. 4, an ohmic layer made of AuGe is deposited on the exposed n$^+$-type GaAs cap layer 11 by an evaporation and lift-off process. Then, the ohmic layer is alloyed and patterned by a photolithography and etching process. Thus, an ohmic source electrode 14S and an ohmic drain electrode 14D are formed.

In FIG. 6, which illustrates a first modification of the GaAs heterojunction field effect semiconductor device of FIG. 4, the Si-doped n$^+$-type AlGaAs wide recess etching stopper layer 10 of FIG. 4 is replaced by a Si-doped n$^+$-type InGaP wide recess etching stopper layer 10'. Even in the GaAs heterojunction field effect semiconductor device of FIG. 6, the gate turn-on voltage $V_f$ can be increased to about 1.2V. Also, the ON-resistance can be small, i.e., about 2Ω·mm.

Figure 7:
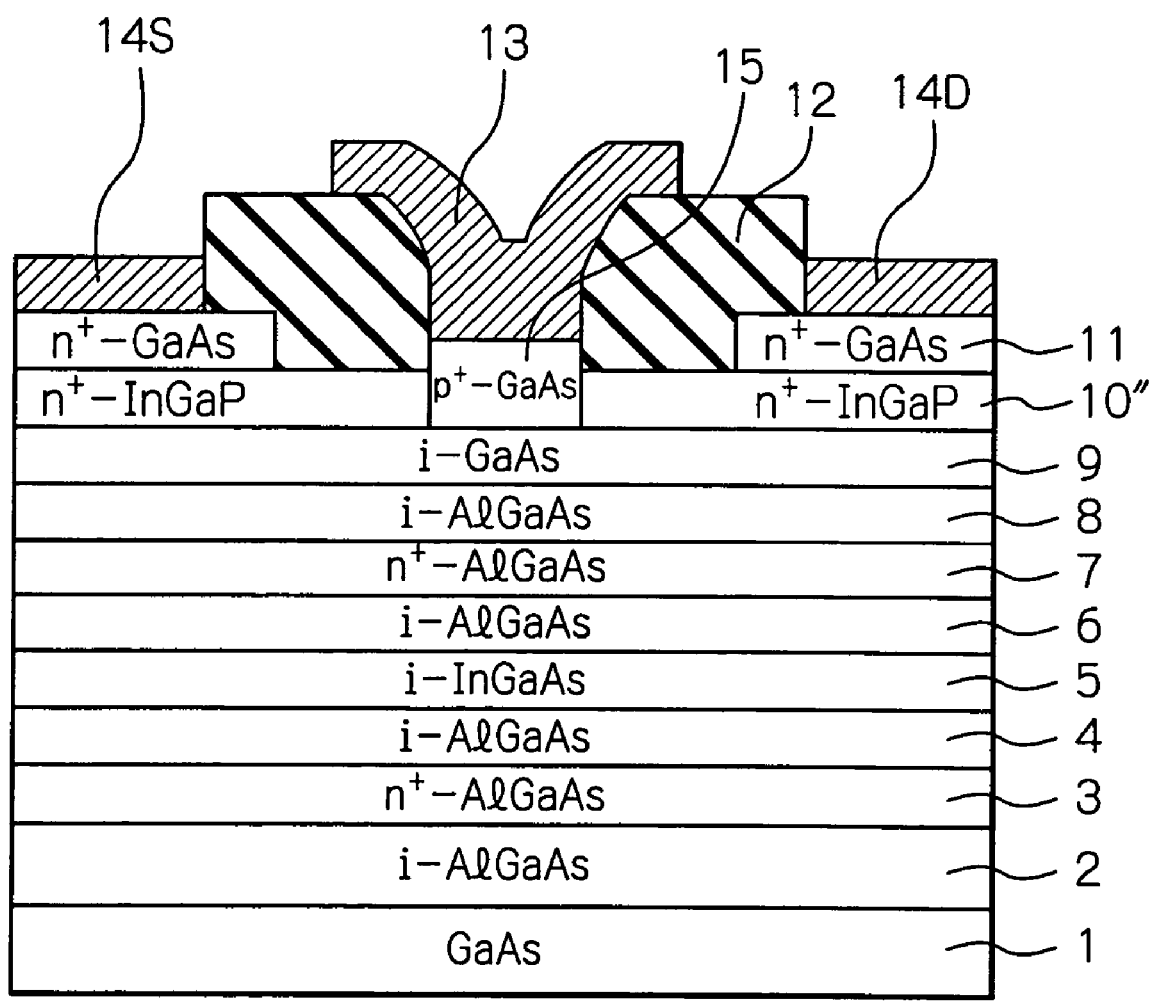

In FIG. 7, which illustrates a second modification of the GaAs heterojunction field effect semiconductor device of FIG. 4, the Si-doped n$^+$-type AlGaAs wide recess etching stopper layer 10 of FIG. 4 is replaced by a Si-doped n$^+$-type InGaP wide recess etching stopper layer 10''. The carbon-doped p$^+$-type GaAs layer 15 is in contact with the Si-doped n$^+$-type InGaP wide recess etching stopper layer 10'' that does not include aluminum which is easily oxidized. Even in the GaAs heterojunction field effect semiconductor device of FIG. 7, the gate turn-on voltage $V_f$ can be increased to about 1.2V. Also, the ON-resistance can be small, i.e., about 2Ω·mm.

When manufacturing the GaAs heterojunction field effect type semiconductor device of FIG. 7, since the complete removing process of the Si-doped n$^+$-type InGaP wide recess etching stopper layer 10'' is unnecessary, the manufacturing steps therefor can be simplified.

Figure 8:
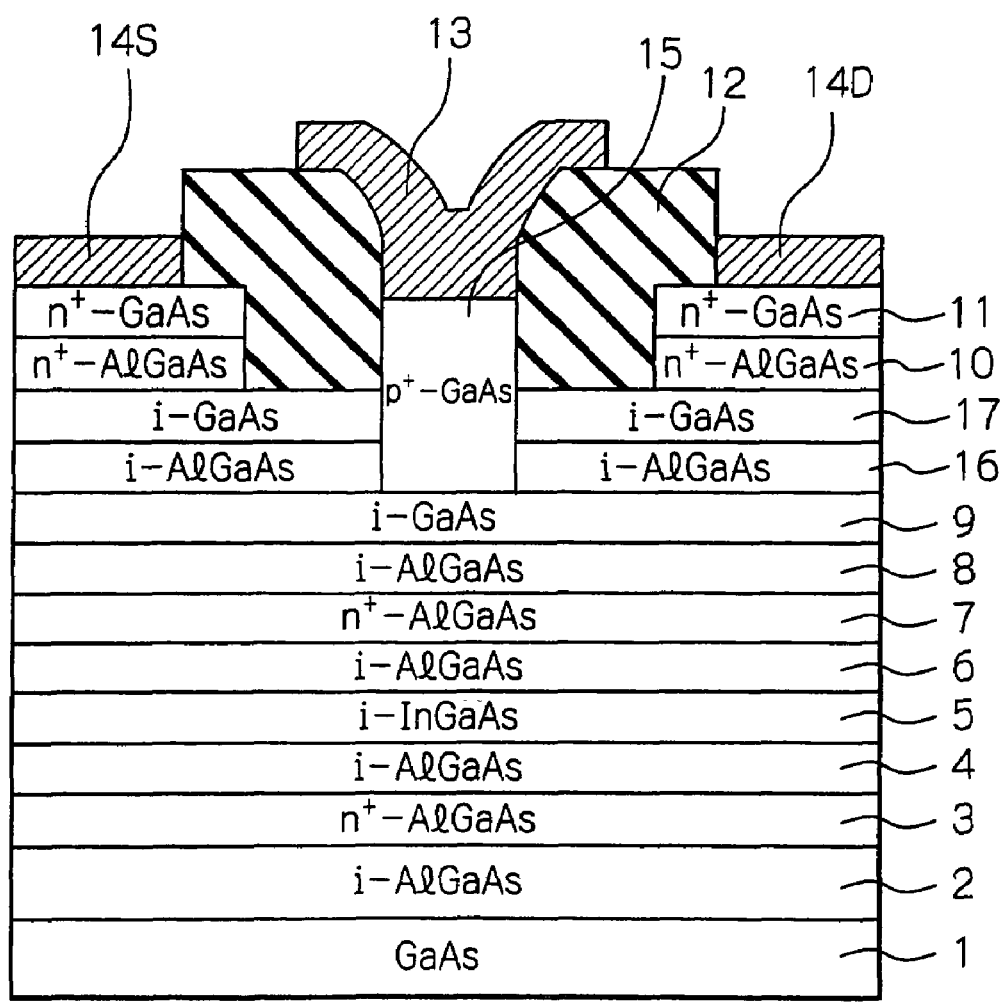
FIG. 8 is a cross-sectional view illustrating a second embodiment of the GaAs heterojunction field effect type semiconductor device according to the present invention.

In FIG. 8, which illustrates a second embodiment of the GaAs heterojunction field effect type semiconductor device according to the present invention, an undoped AlGaAs gate recess stopper layer 16 and an undoped GaAs layer 17 are added to the elements of the GaAs heterojunction field effect type semiconductor device of FIG. 4, and the carbon-doped p$^+$-type GaAs layer 15 is formed on the undoped GaAs Schottky layer 9 through a gate recess provided in the undoped AlGaAs gate recess stopper layer 16 and the undoped GaAs layer 17.

In the same way as in the GaAs heterojunction field effect type semiconductor device of FIG. 4, since the carbon-doped p$^+$-type GaAs layer 15 is not in contact with the undoped AlGaAs Schottky layer 8 whose aluminum component is easily oxidized, the gate turn-on voltage $V_f$ can be increased to about 1.2V. Also, in a similar way to the GaAs heterojunction field effect type semiconductor device of FIG. 1, the ON-resistance between the ohmic source electrode 14S and the ohmic drain electrode 14D can be small, i.e., about 1.6Ω·mm. Also, the mutual conductance is increased to about 470 mS/mm.

Further, since the carbon-doped p$^+$-type GaAs layer 15 is partly buried in the gate recess in the undoped AlGaAs gate recess etching stopper layer 16 and the undoped GaAs layer 17, the sheet resistance around the wide recess in the Si-doped n$^+$-type AlGaAs wide recess etching stopper 10 and the Si-doped n$^+$-type GaAs cap layer 11 can be decreased. That is, a surface potential at the semiconductor surface depletes accumulated electrons in a channel. The increase of the distance between the InGaAs channel layer 5 and the undoped GaAs layer 17 decreases the surface potential effect on the accumulated electrons in the channel. Therefore, the concentration of sheet carriers in the channel is increased by adopting the undoped AlGaAs layer 16 and the undoped GaAs layer 17.

Figure 9A:
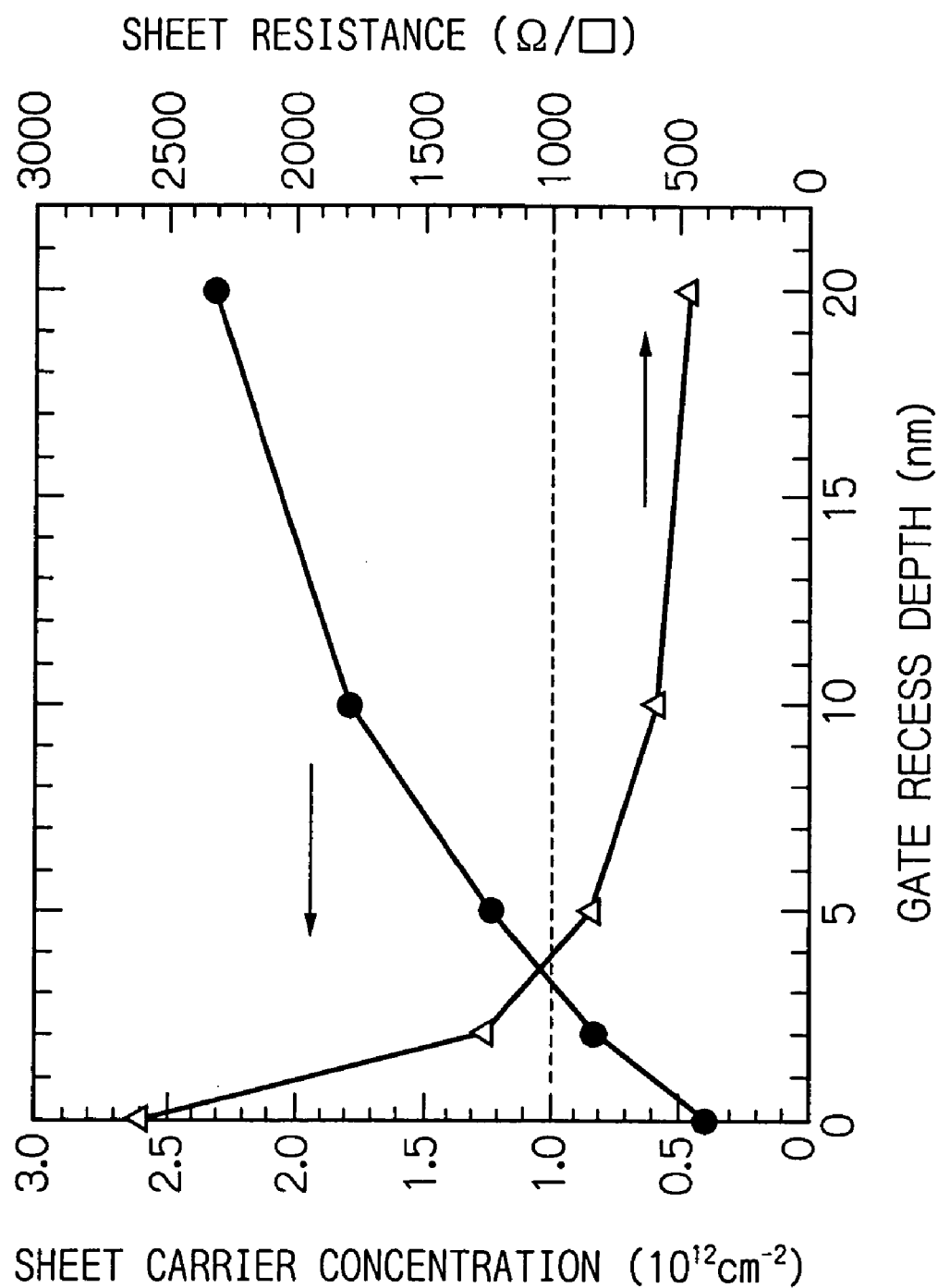
FIG. 9A is a graph showing the gate recess depth characteristics of the device of FIG. 8.

For example, as illustrated in FIG. 9A, which shows the sheet resistance characteristics where the semiconductor device of FIG. 8 is of an enhancement type having a positive threshold voltage of 0.3V, when a gate recess depth represented by the thickness of the undoped AlGaAs gate recess etching stopper layer 16 and the undoped GaAs layer 17 is more than 5 nm, the sheet carrier concentration in the channel is more than $1\times10^{12}$ cm$^{-2}$ and the sheet resistance around the wide recess is less than 1000Ω/□. Also, when the gate recess depth represented is 20 nm, the sheet carrier concentration in the created channel is $2.3\times10^{12}$ cm$^{-2}$ and the sheet resistance around the wide recess is 450Ω/□.

Figure 9B:
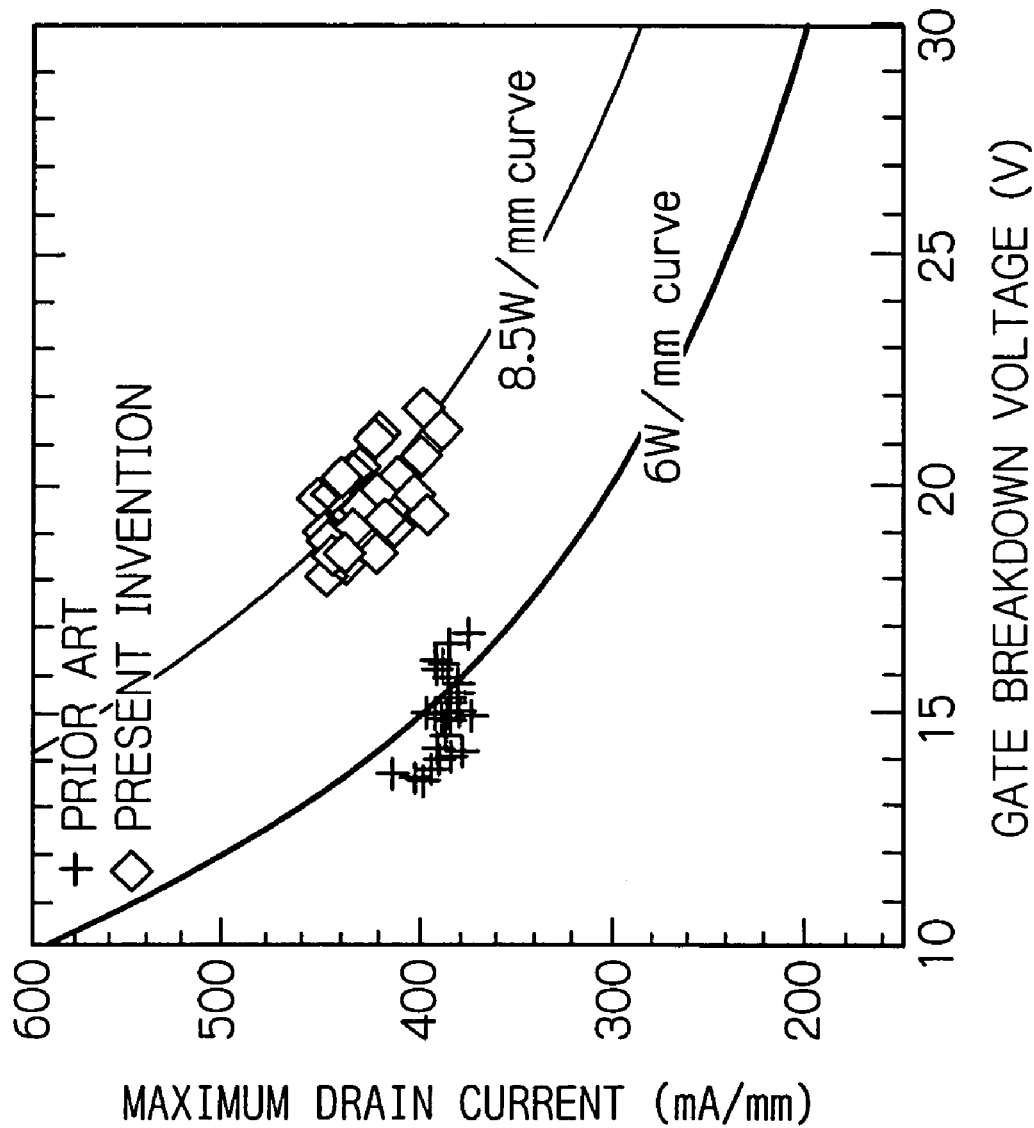
FIG. 9B is a graph showing the gate breakdown voltage-to-maximum drain current characteristics of the device of FIG. 8.

Also, in FIG. 8, since the Schottky barrier is determined by the bandgap of the carbon-doped p$^+$-type GaAs layer 15, a high gate breakdown voltage can be maintained even when the carbon-doped p$^+$-type GaAs layer 15 is partly buried in the gate recess. Moreover, a reduced parasitic resistance by employing the buried p$^+$-type GaAs layer 15 not only reduces the ON-resistance, but also increases a maximum drain current of the device. On the other hand, in FIG. 1, the Schottky barrier is determined by both of the AlGaAs Schottky layer 8 and the GaAs layer 9. If the buried amount of the gate electrode 13 is increased, the gate breakdown voltage can be degraded, because a Schottky barrier between GaAs and a gate electrode is 0.3 eV lower than that of AlGaAs and a gate electrode. As a result, as illustrated in FIG. 9B, which shows the gate breakdown voltage-to-maximum drain current characteristics, the device of FIG. 8 shows higher maximum drain current and higher gate breakdown voltage than those of the device of FIG. 1.

A method for manufacturing the GaAs heterojunction field effect type semiconductor device of FIG. 8 will be explained next with reference to FIGS. 10A through 10J.

First, referring to FIG. 10A, an about 50 nm thick undoped AlGaAs buffer layer 2, an about 4 nm thick n$^+$-type AlGaAs electron supply layer 3 having about $3\times10^{18}$ Si atoms cm$^{-3}$ doped therein, an about 2 nm thick undoped AlGaAs spacer layer 4, an about 15 nm thick undoped InGaAs channel layer 5, an about 2 nm thick undoped AlGaAs spacer layer 6, an about 9 nm thick n$^+$-type AlGaAs electron supply layer 7 having about $3\times10^{18}$ Si atoms cm$^{-3}$ doped therein, an about 7 nm thick AlGaAs Schottky layer 8, an about 5 nm thick undoped GaAs Schottky layer 9, an about 5 nm thick undoped AlGaSAs gate recess etching stopper layer 16, an about 15 nm thick GaAs layer 17, an about 5 nm thick n$^+$-type AlGaAs wide recess etching stopper layer 10 having about $4\times10^{18}$ Si atoms cm$^{-3}$ doped therein and an about 100 nm thick n$^+$-type GaAs cap layer 11 having $4\times10^{18}$ Si atoms cm$^{-3}$ doped therein are sequentially grown on a semi-insulating GaAs substrate 1 by a first epitaxial growth process using an MBE method or an MOVPE method.

Next, referring to FIG. 10B, a photoresist pattern 21 is formed by a photolithography process. Then, the n$^+$-type GaAs cap layer 11 is etched by a dry etching process using the photoresist pattern 21 as a mask and the n$^+$-type AlGaAs wide recess etching stopper layer 10 as a stopper. In this case, a part of the n$^+$-type AlGaAs wide recess etching stopper layer 10 is also etched. Thus, a wide recess 11a is created in the n$^+$-type GaAs cap layer 11.

Next, referring to FIG. 10C, the remainder of the n$^+$-type AlGaAs wide recess etching stopper layer 10 is completely removed by a rinsing process. Then, the photoresist pattern 21 is removed. Thus, the wide recess 11a is further increased to create a wide recess 10a.

Next, referring to FIG. 10D, an insulating layer 12 made of silicon dioxide is deposited on the entire surface by a CVD process.

Figure 10E:
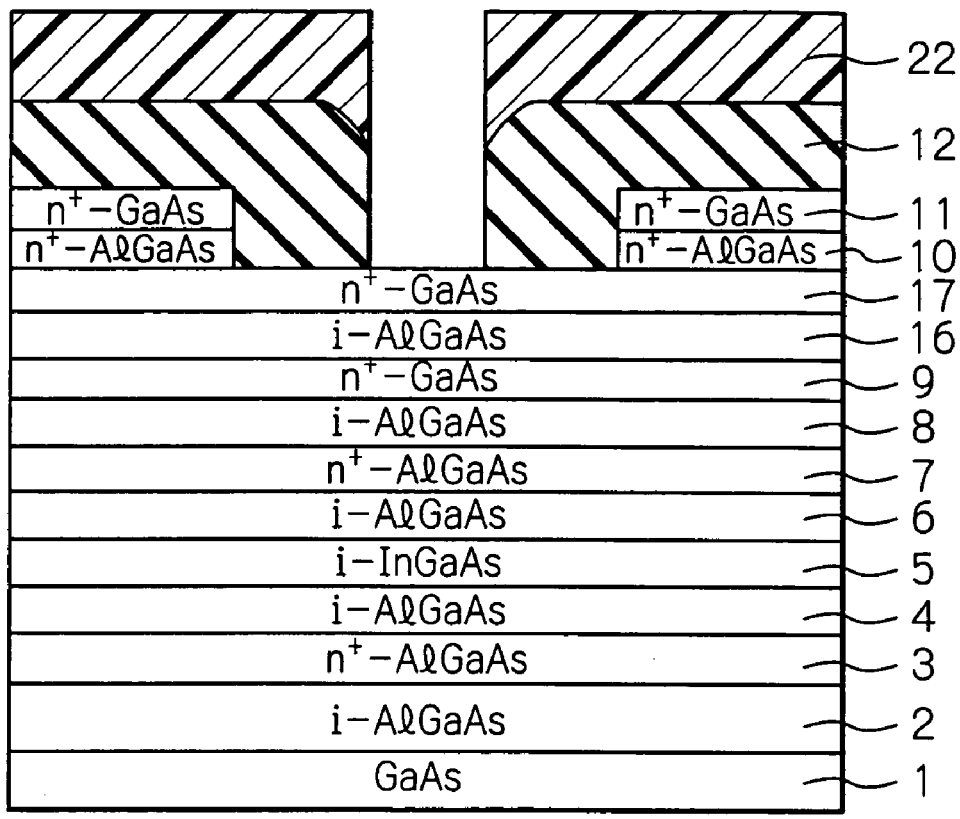

Next, referring to FIG. 10E, a photoresist pattern 22 is formed by a photolithography process. Then, the insulating layer 12 is etched by an etching process using the photoresist pattern 22 as a mask. As a result, the undoped GaAs layer 17 is exposed. Then, the photoresist pattern 22 is removed.

Figure 10F:
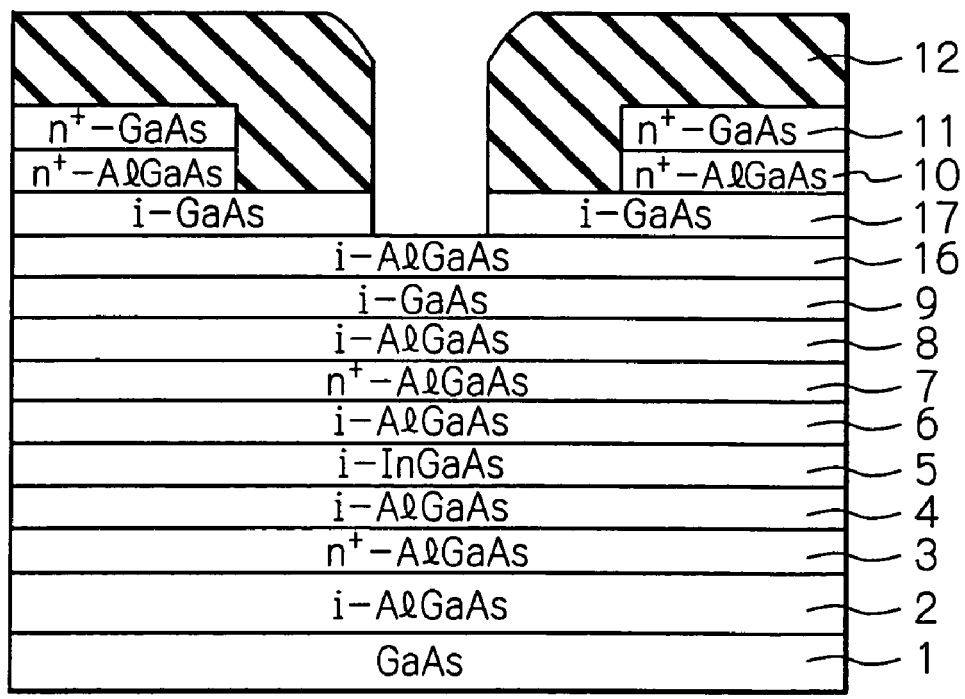

Next, referring to FIG. 10F, the undoped GaAs layer 17 is etched by a dry etching process using the patterned insulating layer 12 as a mask and the undoped AlGaAs gate recess etching stopper layer 16 as a stopper. In this case, a part of the undoped AlGaAs layer 16 is also etched.

Figure 10G:
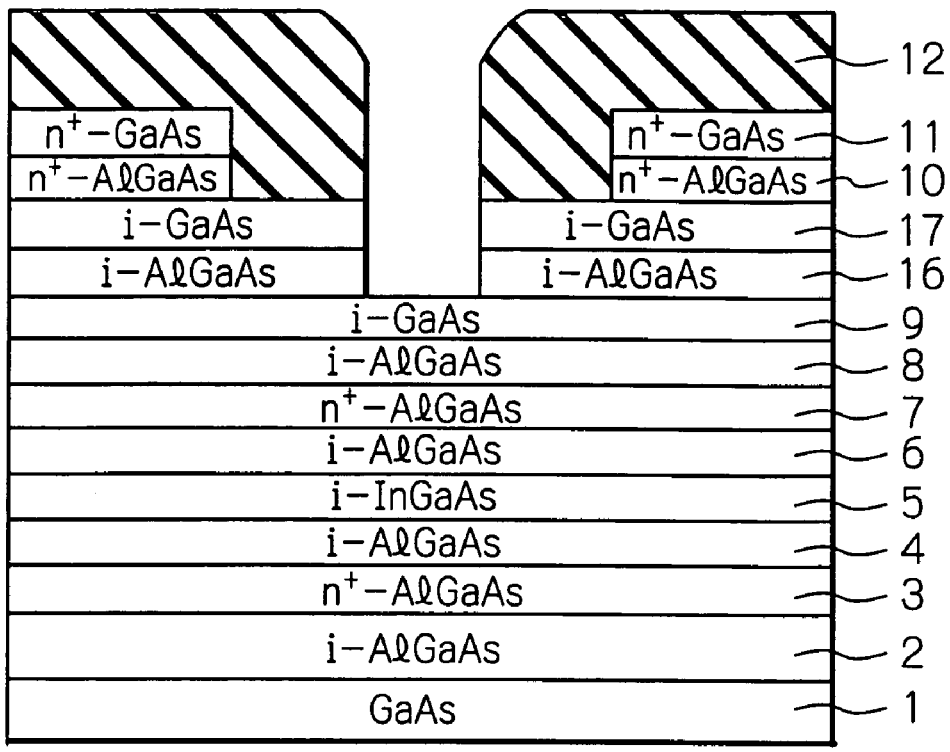

Next, referring to FIG. 10G, the remainder of the undoped AlGaAs gate recess etching stopper 16 is completely removed by a rinsing process. Thus, the undoped GaAs Schottky layer 9 is exposed.

Figure 10H:
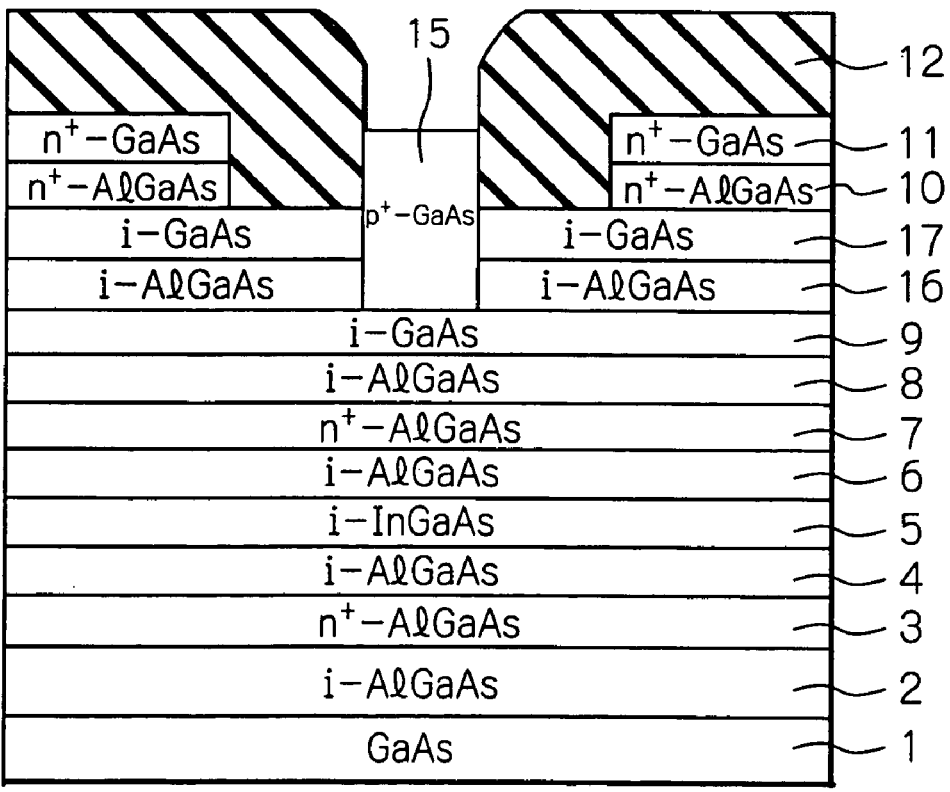

Next, referring to FIG. 10H, an about 80 nm thick carbon-doped p$^+$-type GaAs layer 15 having about $1\times10^{20}$ carbon atoms cm$^{-3}$ doped therein is grown on the exposed undoped GaAs Schottky layer 9 by a second epitaxial growth process using an MOVPE method.

Figure 10I:
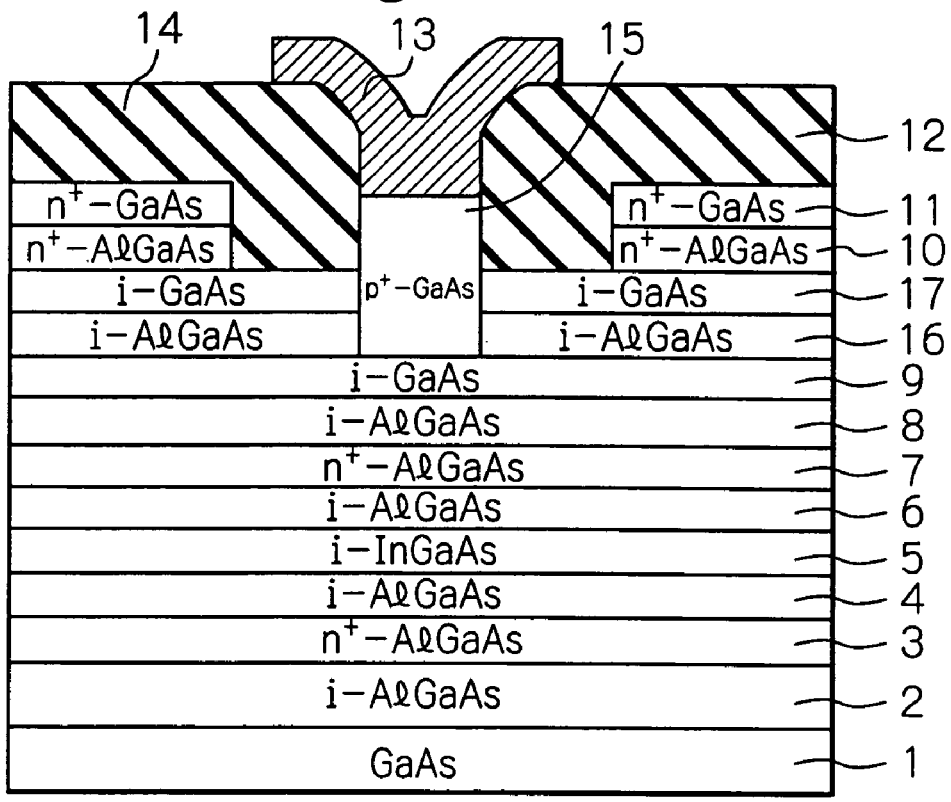

Next, referring to FIG. 10I, a gate electrode 13 made of WSi is formed by a sputtering process. Then, the gate electrode 13 is patterned by a photolithography and etching process.

Figure 10J:
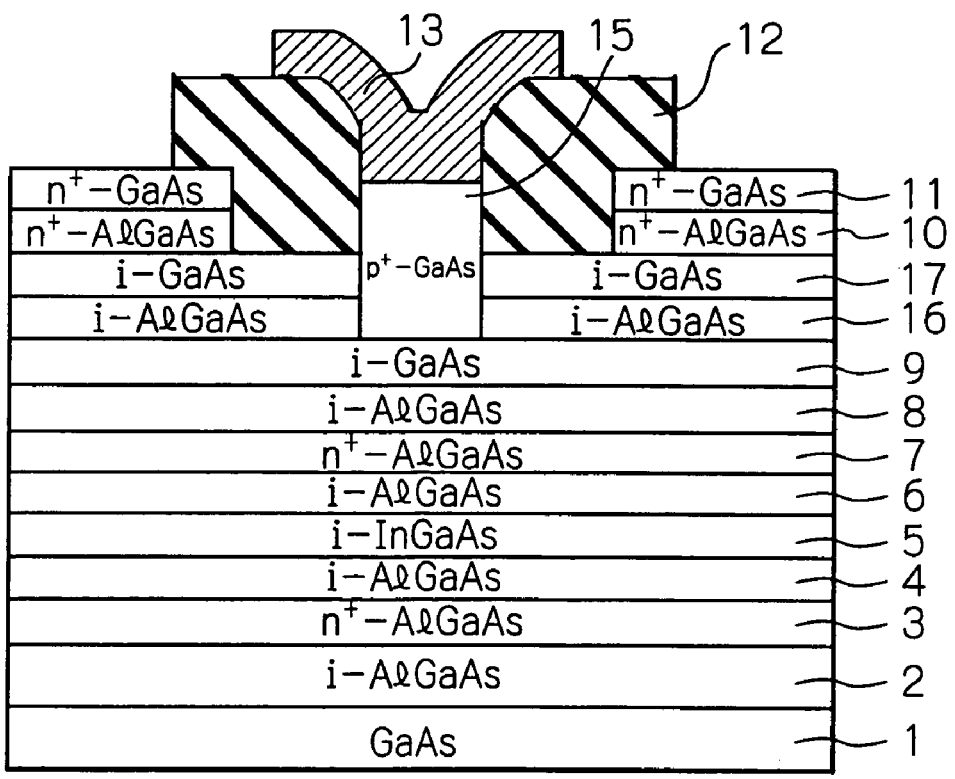

Next, referring to FIG. 10J, the insulating layer 12 is further patterned by a photolithography and etching process. Thus, the n$^+$-type GaAs layer 11 is exposed.

Finally, returning to FIG. 8, an ohmic layer made of AuGe is deposited on the exposed n$^+$-type GaAs cap layer 11 by an evaporation and lift-off process. Then, the ohmic layer is alloyed and patterned by a photolithography and etching process. Thus, an ohmic source electrode 14S and an ohmic drain electrode 14D are formed.

Figure 11:
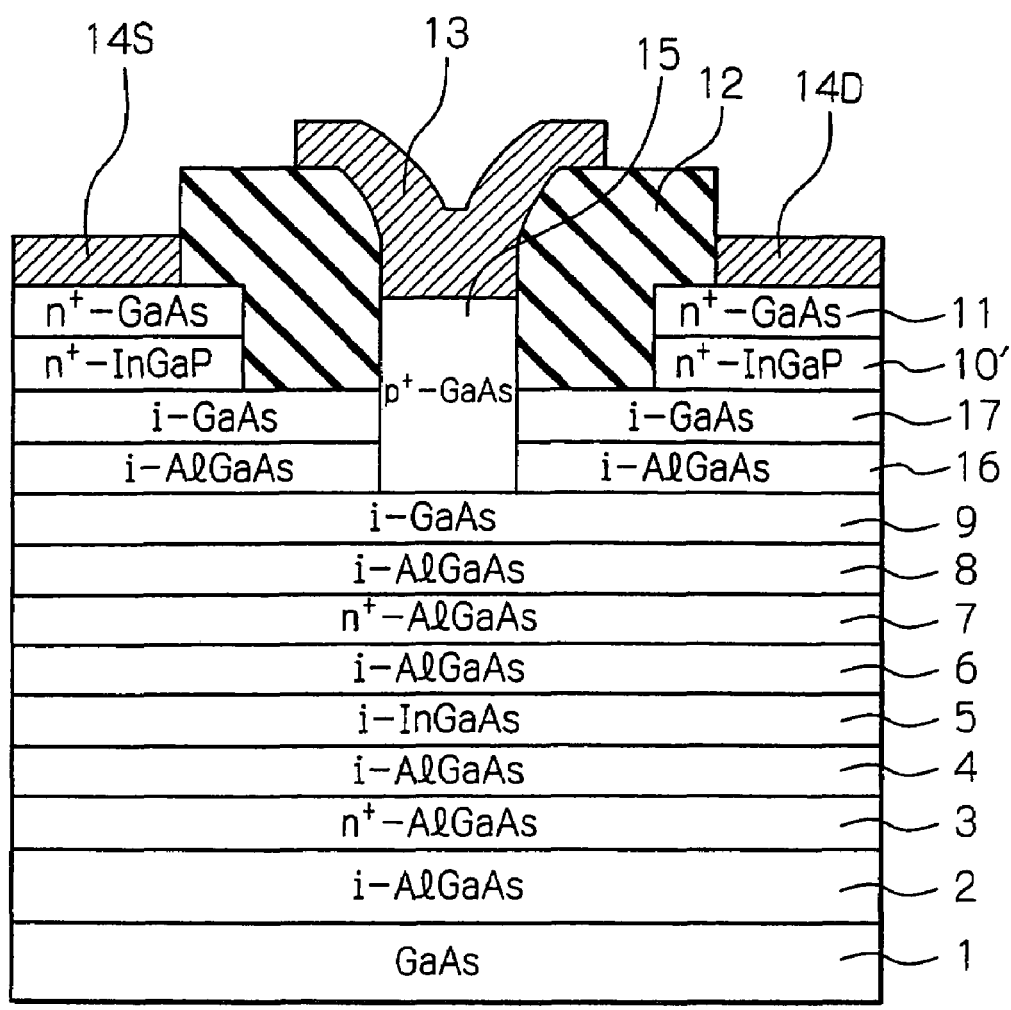
FIGS. 11, 12, 13, 14, 15, 16, 17 and 18 are cross-sectional views illustrating first, second, third, fourth, fifth, sixth, seventh and eighth modifications of the GaAs heterojunction field effect type semiconductor device of FIG. 8.

In FIG. 11, which illustrates a first modification of the GaAs heterojunction field effect semiconductor device of FIG. 8, the Si-doped n$^+$-type AlGaAs wide recess etching stopper layer 10 of FIG. 8 is replaced by a Si-doped n$^+$-type InGaP wide recess etching stopper layer 10'. Even in the GaAs heterojunction field effect semiconductor device of FIG. 11, the gate turn-on voltage V$_f$ can be increased to about 1.2V. Also, the ON-resistance can be small, i.e., about 1.6Ω·mm.

Figure 12:
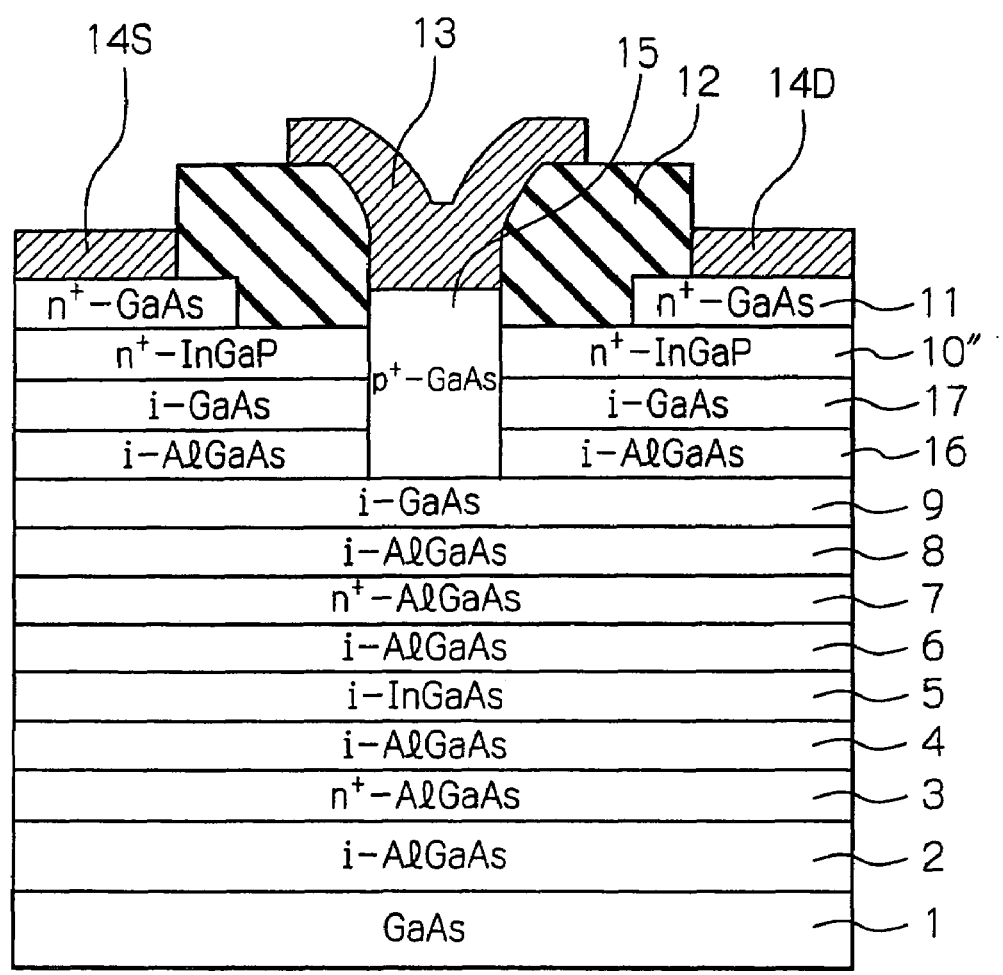

In FIG. 12, which illustrates a second modification of the GaAs heterojunction field effect semiconductor device of FIG. 8, the Si-doped n$^+$-type AlGaAs wide recess etching stopper layer 10 of FIG. 8 is replaced by a Si-doped n$^+$-type InGaP wide recess etching stopper layer 10". The carbon-doped p$^+$-type GaAs layer 15 is in contact with the Si-doped n$^+$-type InGaP wide recess etching stopper layer 10" that does not include aluminum which is easily oxidized. Even in the GaAs heterojunction field effect semiconductor device of FIG. 12, the gate turn-on voltage V$_f$ can be increased to about 1.2V. Also, the ON-resistance can be small, i.e., about 1.6Ω·mm.

When manufacturing the GaAs heterojunction field effect type semiconductor device of FIG. 12, since the complete removing process of the Si-doped n$^+$-type InGaP wide recess etching stopper layer 10" is unnecessary, the manufacturing steps therefor can be simplified.

Figure 13:
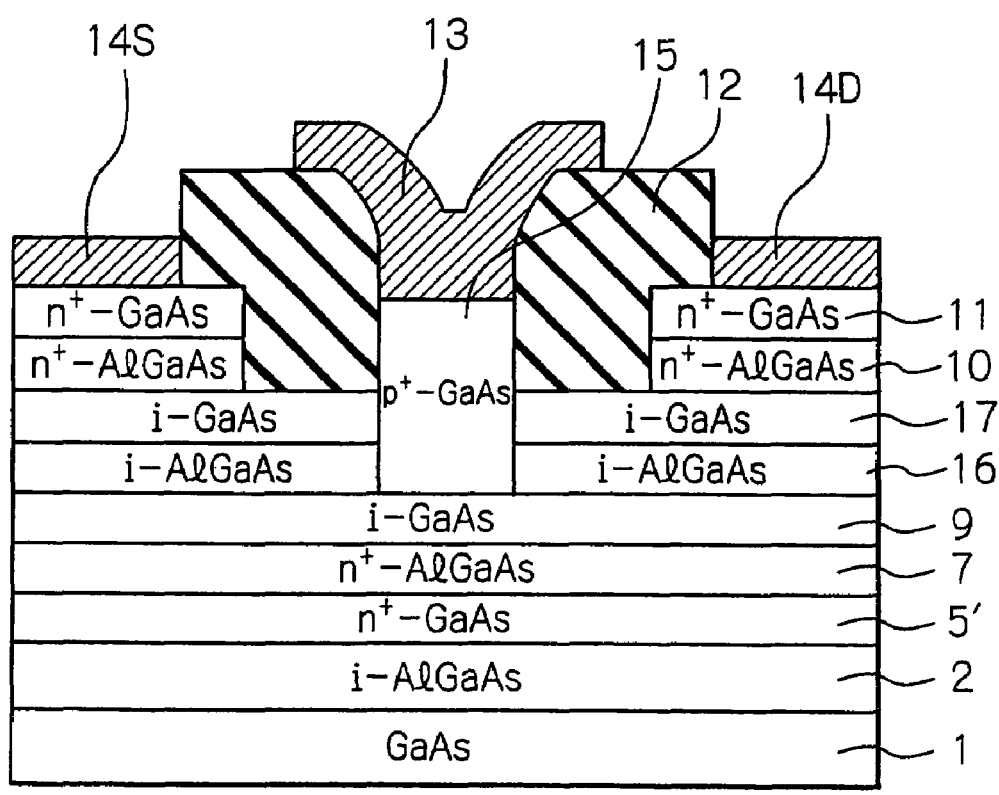

In FIG. 13, which illustrates a third modification of the GaAs heterojunction field effect semiconductor device of FIG. 8, the Si-doped n$^+$-type AlGaAs electron supply layer 3, the undoped AlGaAs spacer layers 4 and 6, and the undoped AlGaAs Schottky layer 8 of FIG. 8 are deleted, and the undoped InGaAs channel layer 5 of FIG. 8 is replaced by a Si-doped n$^+$-type GaAs channel layer 5'. Even in the GaAs heterojunction field effect semiconductor device of FIG. 13, the gate turn-on voltage V$_f$ can be increased to about 1.2V. Also, the ON-resistance can be small, i.e., about 1.6Ω·mm.

When manufacturing the GaAs heterojunction field effect type semiconductor device of FIG. 13, since the layers 3, 4, 6 and 8 are unnecessary, the manufacturing steps therefor can be simplified.

Figure 14:
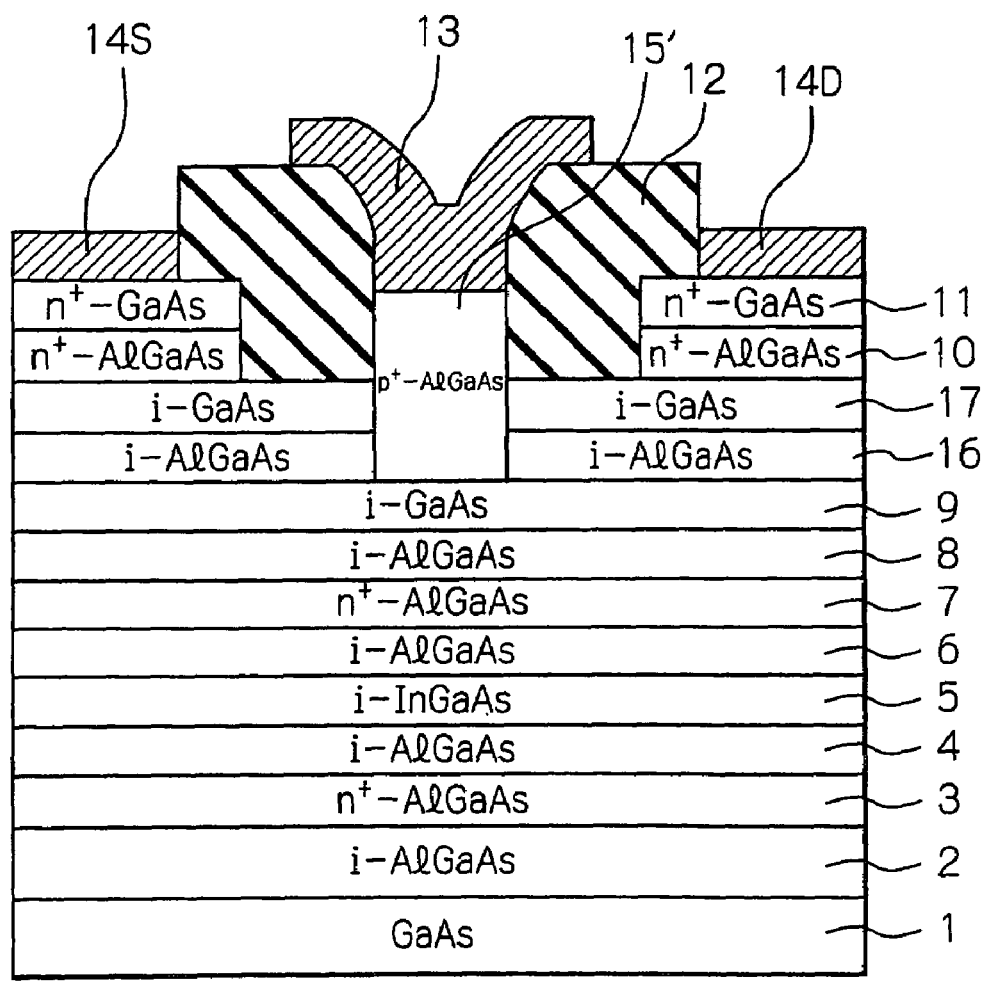

In FIG. 14, which illustrates a fourth modification of the GaAs heterojunction field effect semiconductor device of FIG. 8, the carbon-doped p$^+$-type GaAs layer 15 of FIG. 8 is replaced by a carbon-doped p$^+$-type AlGaAs layer 15'.

In the GaAs heterojunction field effect semiconductor device of FIG. 14, the bandgap of AlGaAs is generally larger than that (E$_g$=1.424 eV) of GaAs. That is, the bandgap E$_g$ of Al$_x$Ga$_{1-x}$As is approximated by $$E_g = 1.424 + 1.247x (0 \leq x \leq 0.45)$$
$$= 1.900 + 0.125x + 0.143x^2 (0.45 \leq x \leq 1.0)$$

Therefore, if the bandgap of AlGaAs is larger than that of GaAs by about 0.3 eV, the effective Schottky barrier is about 1.7 eV. As a result, the gate turn-on voltage V$_f$ can be increased to about 1.5V. Also, the ON-resistance between the ohmic source electrode 14S and the ohmic drain electrode 14D can be small, i.e., about 1.6Ω·mm.

Figure 15:
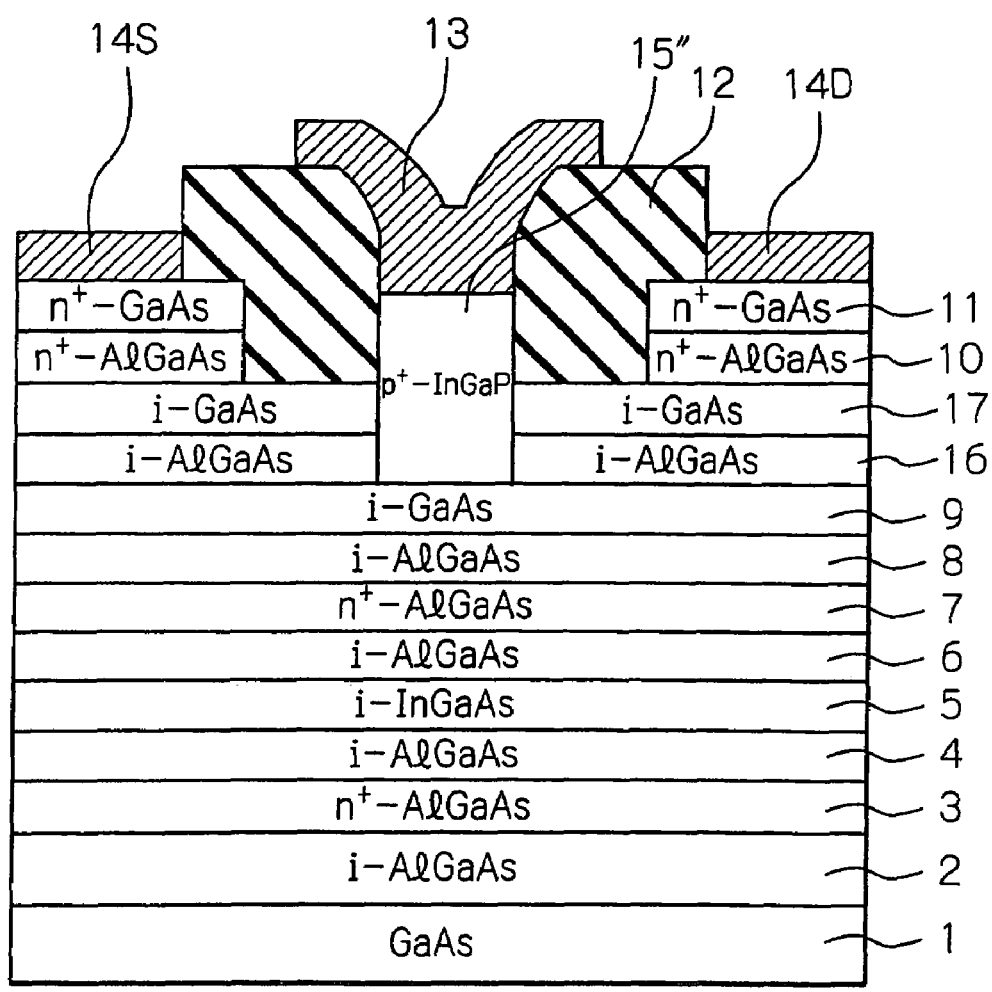

In FIG. 15, which illustrates a fifth modification of the GaAs heterojunction field effect semiconductor device of FIG. 8, the carbon-doped p$^+$-type GaAs layer 15 of FIG. 8 is replaced by a carbon-doped p$^+$-type InGaP layer 15".

In the GaAs heterojunction field effect semiconductor device of FIG. 15, since the bandgap of InGaP is generally larger than that (E$_g$=1.424 eV) of GaAs. That is, the bandgap E$_g$ of InGaP is 1.8 to 1.9 eV. If the bandgap of InGaP is larger than that of GaAs by about 0.4 eV, the effective Schottky barrier is about 1.8 eV. As a result, the gate turn-on voltage V$_f$ can be increased to about 1.6V. Also, the ON-resistance between the ohmic source electrode 14S and the ohmic drain electrode 14D can be small, i.e., about 1.6Ω·mm.

Figure 16:
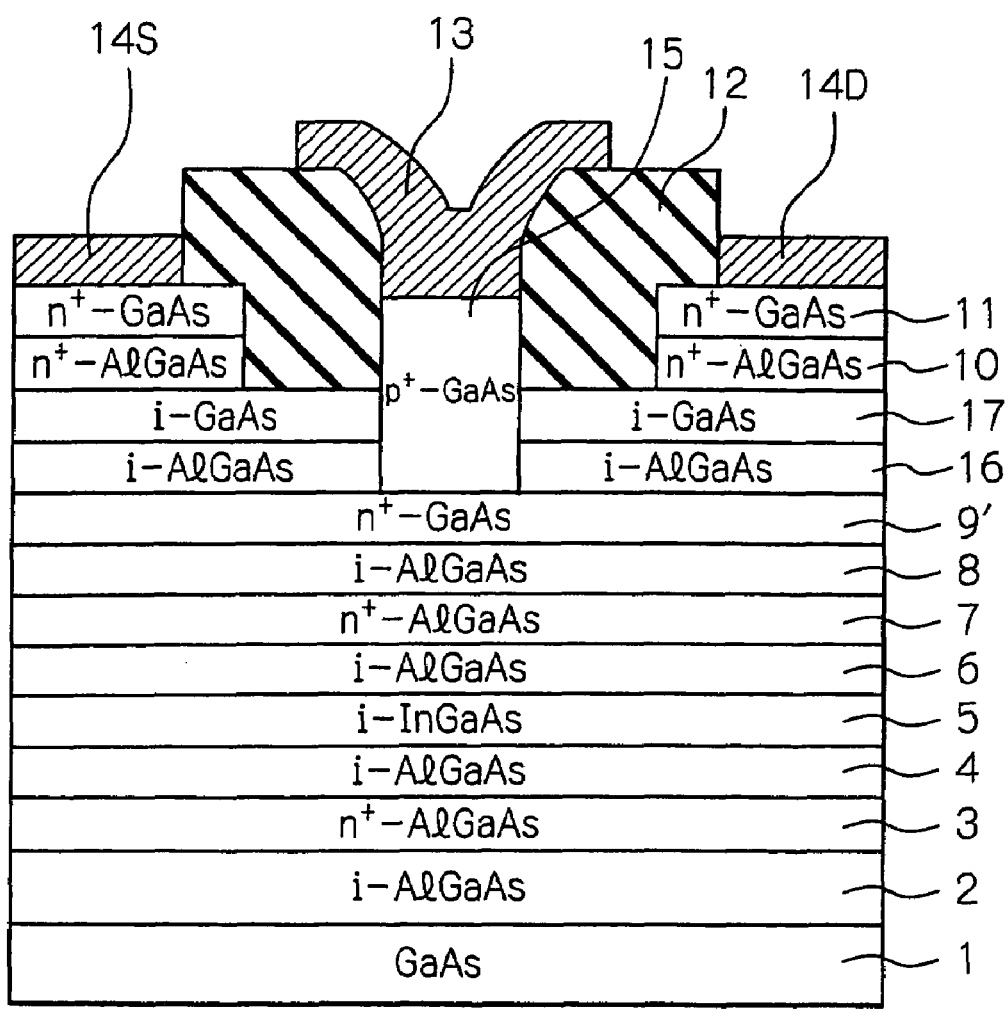

In FIG. 16, which illustrates a sixth modification of the GaAs heterojunction field effect semiconductor device of FIG. 8, the undoped GaAs Schottky layer 9 of FIG. 8 is replaced by a Si-doped n$^+$-type GaAs Schottky layer 9' having about $5\times10^{17}$ Si atoms cm$^{-3}$ doped therein.

In the GaAs heterojunction field effect semiconductor device of FIG. 16, since the GaAs Schottky layer 9' is of an n$^+$-type, the effective Schottky barrier between the carbon-doped p$^+$-type GaAs layer 15 and the Si-doped n$^+$-type GaAs Schottky layer 9' is increased, so that the gate turn-on voltage V$_f$ can be increased to about 1.2V. Also, since the Si-doped n$^+$-type GaAs Schottky layer 9' contributes to decrease the contact resistance between the ohmic source electrode 14S and the ohmic drain electrode 14D, the ON-resistance can be small, i.e., about 1.6Ω·mm.

Figure 17:
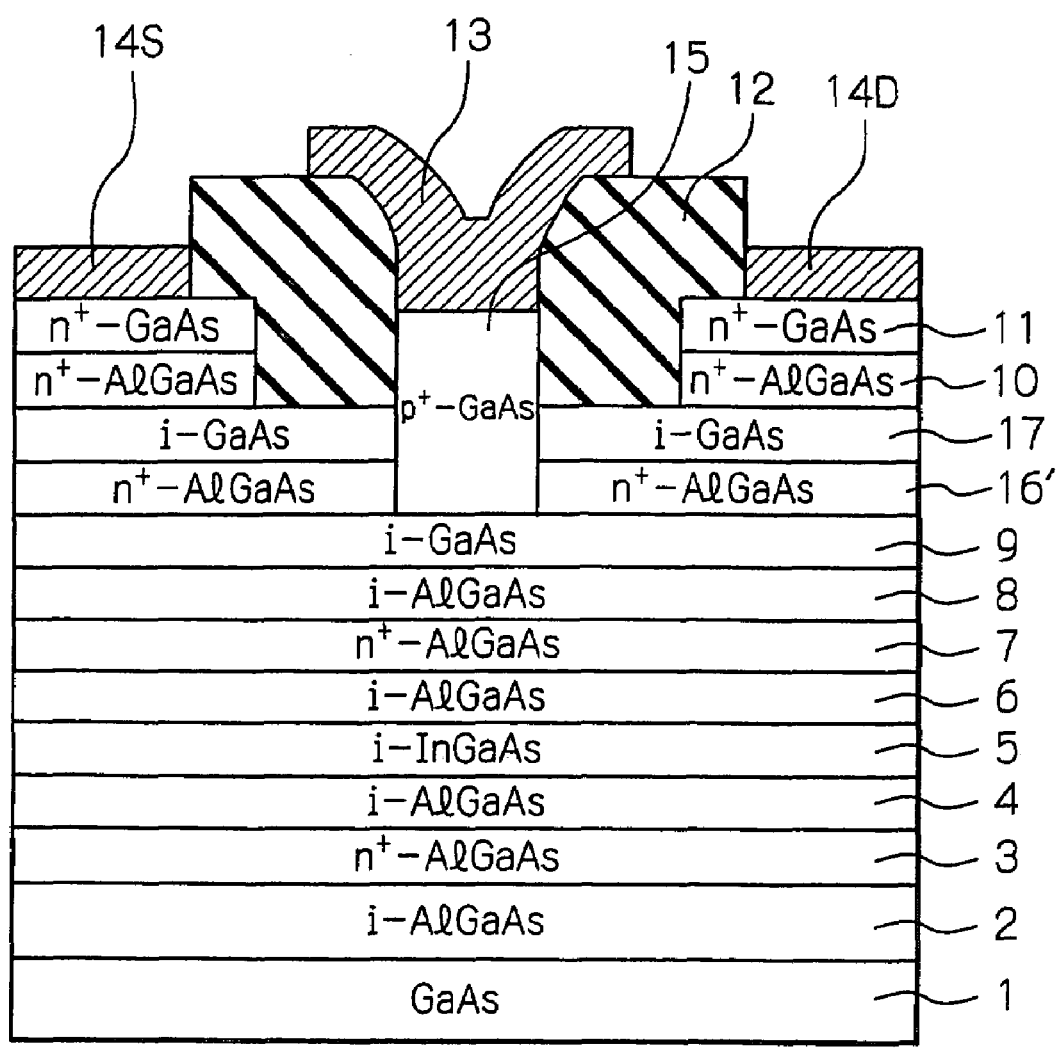

In FIG. 17, which illustrates a seventh modification of the GaAs heterojunction field effect semiconductor device of FIG. 8, the undoped AlGaAs layer 16 of FIG. 8 is replaced by a Si-doped n$^+$-type AlGaAs layer 16' having about $5 \times 10^{17}$ Si atoms cm$^{-3}$ doped therein.

In the GaAs heterojunction field effect semiconductor device of FIG. 17, since the AlGaAs layer 16' is of an n$^+$-type, the effective Schottky barrier between the carbon-doped p$^+$-type GaAs layer 15 and the Si-doped n$^+$-type AlGaAs layer 16' is increased, so that the gate turn-on voltage $V_f$ can be increased to about 1.2V. Also, since the Si-doped n$^+$-type GaAs layer 6' contributes to decrease the contact resistance between the ohmic source electrode 14S and the ohmic drain electrode 14D, the ON-resistance between the ohmic source electrode 14S and the ohmic drain electrode 14D can be small, i.e., about 1.9Ω·mm.

Figure 18:
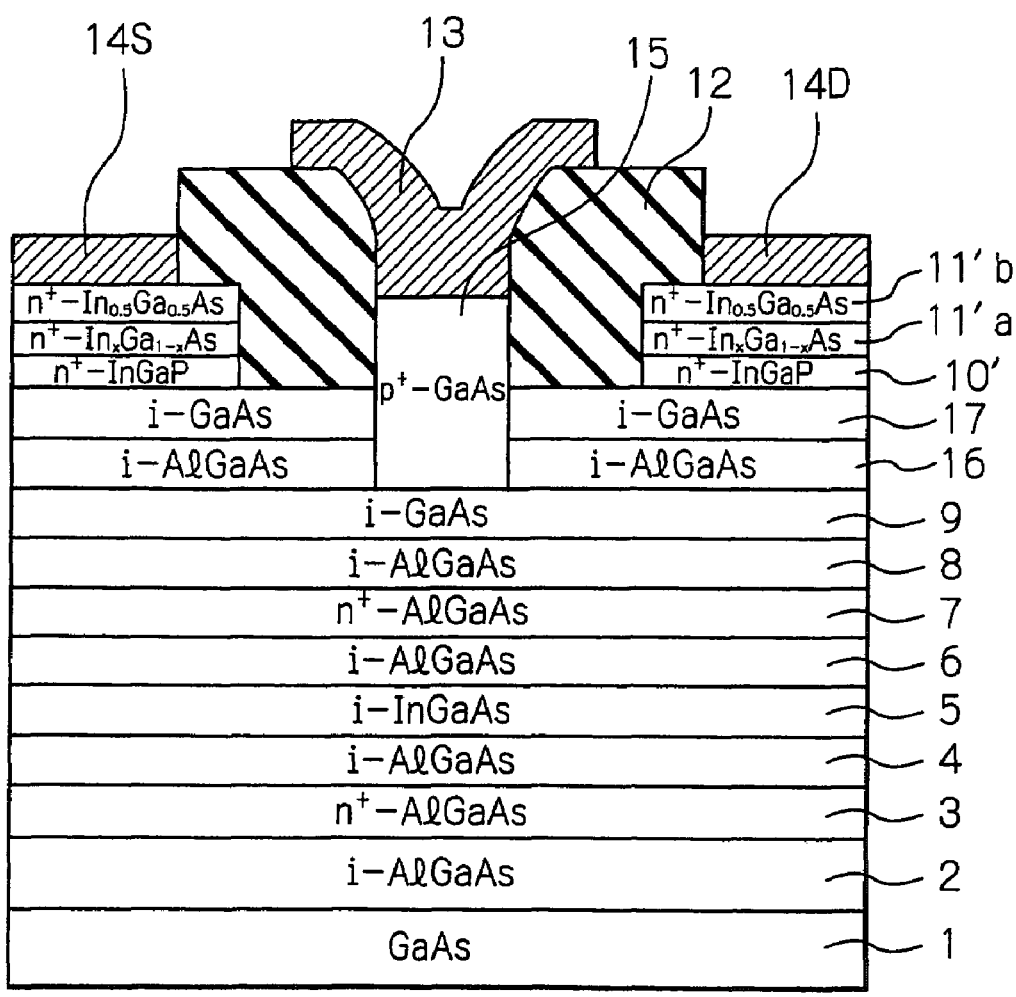

In FIG. 18, which illustrates an eighth modification of the GaAs heterojunction field effect semiconductor device of FIG. 8, the Si-doped n$^+$-type AlGaAs wide recess etching stopper layer 10 of FIG. 8 is replaced by a Si-doped n$^+$-type InGaP wide recess etching stopper layer 10', and the Si-doped n$^+$-type GaAs cap layer 11 of FIG. 8 is replaced by a Si-doped n$^+$-type In$_x$Ga$_{1-x}$As cap layer 11'$a$ having about $2 \times 10^{19}$ Si atoms cm$^{-3}$ doped therein and a Si-doped n$^+$-type In$_{0.5}$Ga$_{0.5}$As cap layer 11'$b$ having about $2 \times 10^{19}$ Si atoms cm$^{-3}$ doped therein. Since InGaAs does not lattice match with GaAs, the Si-doped n$^+$-type In$_x$Ga$_{1-x}$As cap layer 11'$a$ ($0 \leq x < 0.5$) is inserted between the Si-doped n$^+$-type InGaP wide recess etching stopper layer 10' and the Si-doped n$^+$-type In$_{0.5}$Ga$_{0.5}$As cap layer 11'$b$.

In the GaAs heterojunction field effect semiconductor device of FIG. 18, the gate turn-on voltage $V_f$ can be increased to about 1.2V. Also, since the Si-doped n$^+$-type InGaAs cap layers 11'$a$ and 11'$b$ contribute to decrease the contact resistance between the ohmic source electrode 14S and the ohmic drain electrode 14D, the ON-resistance between the ohmic source electrode 14S and the ohmic drain electrode 14D can be small, i.e., about 1.5Ω·mm.

The modifications of the second embodiments as illustrated in FIGS. 13, 14, 15, 16 and 18 can be applied to the first embodiment of FIG. 4.

In the above-described embodiments, p-type impurities such as Mg or Zn other than carbon can be doped into the p$^+$-type GaAs layer 15, the p$^+$-type AlGaAs layer 15' or the p$^+$-type InGaP layer 15". Also, if the channel layer stores p-type carries, the GaAs layer 15, the AlGaAs layer 15' and the InGaP layer 15" can be of an n$^+$-type.

Further, in the above-described embodiments, the insulating layer 12 can be made of SiN$_x$ or SiN$_x$O.

As explained hereinabove, according to the present invention, the gate turn-on voltage $V_f$ can be increased and the ON current can be decreased.

The invention claimed is:

1. A heterojunction field effect type semiconductor device, comprising:
    a GaAs substrate;
    a channel layer formed over said GaAs substrate;
    a first semiconductor layer including no aluminum formed over said channel layer;
    a cap layer of a first conductivity type formed on said first semiconductor layer, said cap layer creating a first recess on said first semiconductor layer;
    first and second ohmic electrodes formed on said cap layer;
    a second semiconductor layer of a second conductivity type formed on said first semiconductor layer within said first recess, said second semiconductor layer being isolated from said cap layer;
    a gate electrode formed on said second semiconductor layer; and
    a third semiconductor layer made of GaAs/AlGaAs interposed between said first semiconductor layer, wherein said third semiconductor layer comprises an GaAs layer formed on an AlGaAs layer, and said cap layer and having a second recess,
    said second semiconductor layer passing through the second recess of said third semiconductor layer to reach said first semiconductor layer.

2. The heterojunction field effect type semiconductor device as set forth in claim 1, wherein said channel layer comprises an undoped InGaAs layer.

3. The heterojunction field effect type semiconductor device as set forth in claim 1, wherein said channel layer comprises a GaAs layer of said first conductivity type.

4. The heterojunction field effect type semiconductor device as set forth in claim 1, wherein said first semiconductor layer comprises an undoped GaAs layer.

5. The heterojunction field effect type semiconductor device as set forth in claim 1, wherein each of said cap layer comprises a GaAs layer.

6. The heterojunction field effect type semiconductor device as set forth in claim 1, further comprising a wide recess etching stopper layer of said first conductivity type beneath said cap layer.

7. The heterojunction field effect type semiconductor device as set forth in claim 6, wherein said wide recess etching stopper layer comprises an AlGaAs layer.

8. The heterojunction field effect type semiconductor device as set forth in claim 6, wherein said wide recess etching stopper layer comprises an InGaP layer.

9. The heterojunction field effect type semiconductor device as set forth in claim 1, wherein said second semiconductor layer comprises a GaAs layer.

10. The heterojunction field effect type semiconductor device as set forth in claim 1, wherein said second semiconductor layer comprises an AlGaAs layer.

11. The heterojunction field effect type semiconductor device as set forth in claim 1, wherein said second semiconductor layer comprises an InGaP layer.

12. The heterojunction field effect type semiconductor device as set forth in claim 1, wherein said cap layer comprises:
    an In$_x$Ga$_{1-x}$As ($0 \leq x < 0.5$) cap layer; and
    an In$_{0.5}$Ga$_{0.5}$As cap layer formed on said In$_x$Ga$_{1-x}$As cap layer,
    said device further comprising an InGaP wide recess etching stopper layer of said first conductive type beneath said In$_x$Ga$_{1-x}$As cap layer.

13. The heterojunction field effect type semiconductor device as set forth in claim 1, wherein said third semiconductor layer has a thickness of more than 5 nm.

14. The heterojunction field effect type semiconductor device as set forth in claim 1, wherein:
    said AlGaAs layer of said third semiconductor layer is an undoped AlGaAs; and
    said GaAs layer of said third semiconductor layer formed on said undoped AlGaAs layer is an undoped GaAs.

15. The heterojunction field effect type semiconductor device as set forth in claim 14, wherein said first semiconductor layer is of said first conductivity type.

16. The heterojunction field effect type semiconductor device as set forth in claim 1, wherein
    said AlGaAs layer of said third semiconductor layer is of a first conductivity type; and
    said GaAs layer formed on said first conductivity type AlGaAs layer is an undoped GaAs.

* * * * *